(12) United States Patent
Bauer et al.

(10) Patent No.: US 6,297,665 B1
(45) Date of Patent: Oct. 2, 2001

(54) FPGA ARCHITECTURE WITH DUAL-PORT DEEP LOOK-UP TABLE RAMS

(75) Inventors: Trevor J. Bauer; Steven P. Young, both of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/574,445

(22) Filed: May 19, 2000

Related U.S. Application Data

(63) Continuation-in-part of application No. 09/253,313, filed on Feb. 18, 1999, which is a continuation-in-part of application No. 08/754,421, filed on Nov. 22, 1996, now Pat. No. 5,889,413.

(51) Int. Cl.$^7$ ................................................ H03K 19/177
(52) U.S. Cl. ........................................... 326/40; 326/38
(58) Field of Search .................................... 326/37–41

(56) References Cited

U.S. PATENT DOCUMENTS

| | | |
|---|---|---|
| Re. 34,363 | 8/1993 | Freeman . |
| 4,821,233 | 4/1989 | Hsieh . |
| 4,870,302 | 9/1989 | Freeman . |
| 4,967,107 | 10/1990 | Kaplinsky . |
| 5,267,187 | 11/1993 | Hsieh et al. . |
| 5,291,079 | 3/1994 | Goetting . |
| 5,321,399 | 6/1994 | Notain et al. . |
| 5,325,109 | 6/1994 | Duckworth . |
| 5,343,406 | 8/1994 | Freeman et al. . |
| 5,349,250 | 9/1994 | New . |
| 5,352,940 | 10/1994 | Watson . |
| 5,386,156 | 1/1995 | Britton et al. . |
| 5,394,031 | 2/1995 | Britton et al. . |
| 5,414,377 | 5/1995 | Freidin . |
| 5,422,823 | 6/1995 | Agrawal et al. . |
| 5,442,306 | 8/1995 | Woo . |
| 5,488,316 | 1/1996 | Freeman et al. . |
| 5,694,056 | 12/1997 | Mahoney et al. . |

OTHER PUBLICATIONS

Xilinx, Inc., "the Programmable Logic Data Book", 1996, available from Xilinx, Inc., 2100 Logic Drive, San Jose, California 95124, pp. 4–1 through 4–372.

Xilinx, Inc., "The Programmable Logic Data Book 1999", available from Xilinx, Inc., 2100 Logic Drive, San Jose, California 95124, pp. 3–1 to 3–60.

*Primary Examiner*—Michael Tokar
*Assistant Examiner*—Don Phu Le
(74) *Attorney, Agent, or Firm*—Edel M. Young

(57) ABSTRACT

A configurable logic block (CLB) having a plurality of identical configurable logic element (CLE) slices is provided. Each CLE slice includes a plurality of function generators (lookup tables) that can be configured to form a random access memory (RAM). The width and depth of the RAM are selectable by controlling the routing of signals within the CLE slices. A hierarchy of wide function multiplexers (F5, F6, and F7 multiplexers) are provided to selectively route read data values from the lookup tables. Another set of multiplexers is used to selectively route write data values to the lookup tables. These multiplexers can be configured to provide a single write data value to all of the lookup tables to form a deep RAM. Alternatively, these multiplexers can be configured to provide one write data value to half of the lookup tables, and another write data value to the other half of the lookup tables. This pattern repeats down to the level where these multiplexers can be configured to provide a different write data value to each of the lookup tables. A write control circuit is also provided in each CLE slice to provide write enable signals to the lookup tables in a manner consistent with the selected RAM size. Read and write addresses are provided in a manner that enables the CLB to be operated as a dual-port RAM having selectable width and depth.

12 Claims, 20 Drawing Sheets

2-input Lookup Table

Memory Cell for Lookup Table 4-input Lookup Table

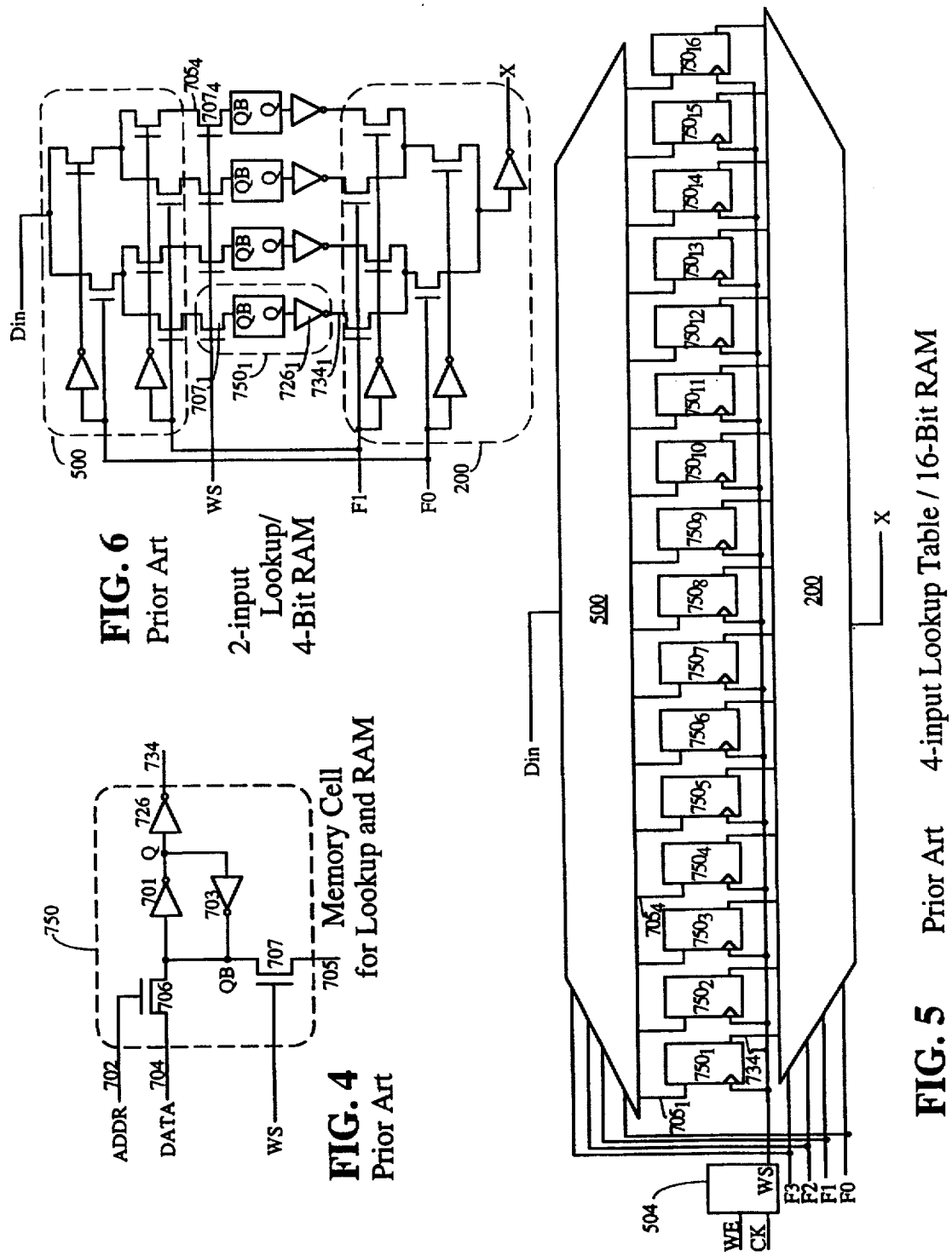
FIG. 6 Prior Art  2-input Lookup/4-Bit RAM
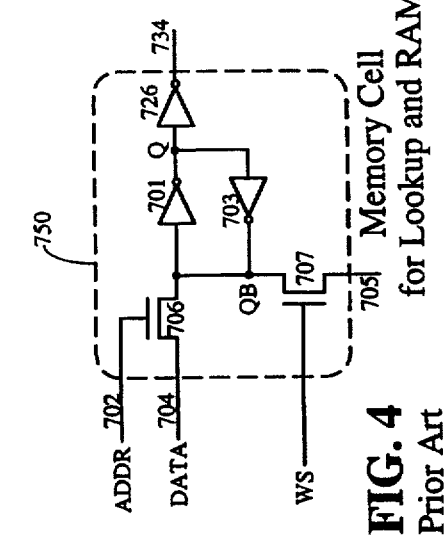
FIG. 4 Prior Art  Memory Cell for Lookup and RAM
FIG. 5 Prior Art  4-input Lookup Table / 16-Bit RAM

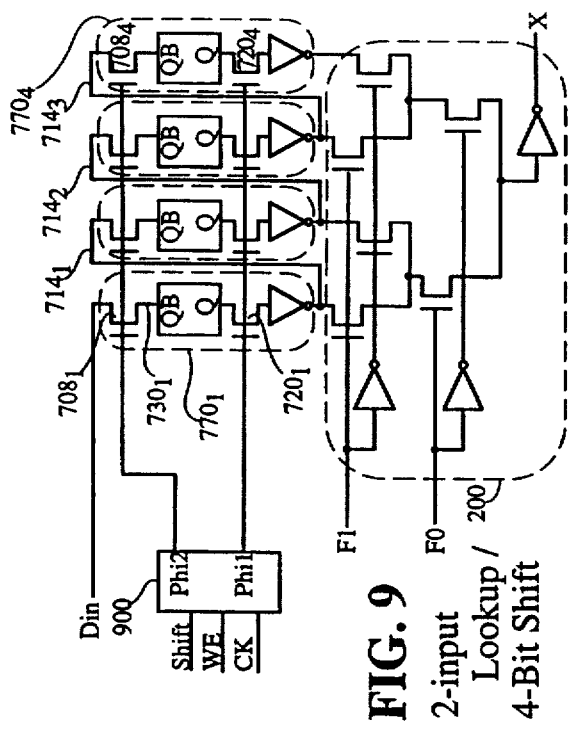
FIG. 9 2-input Lookup / 4-Bit Shift
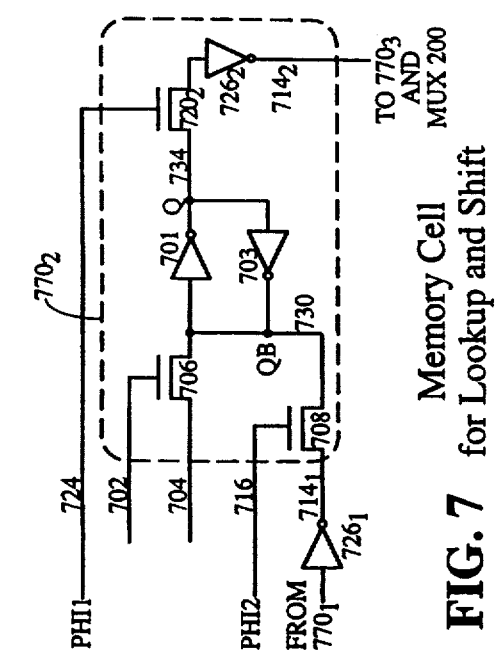
FIG. 7 Memory Cell for Lookup and Shift
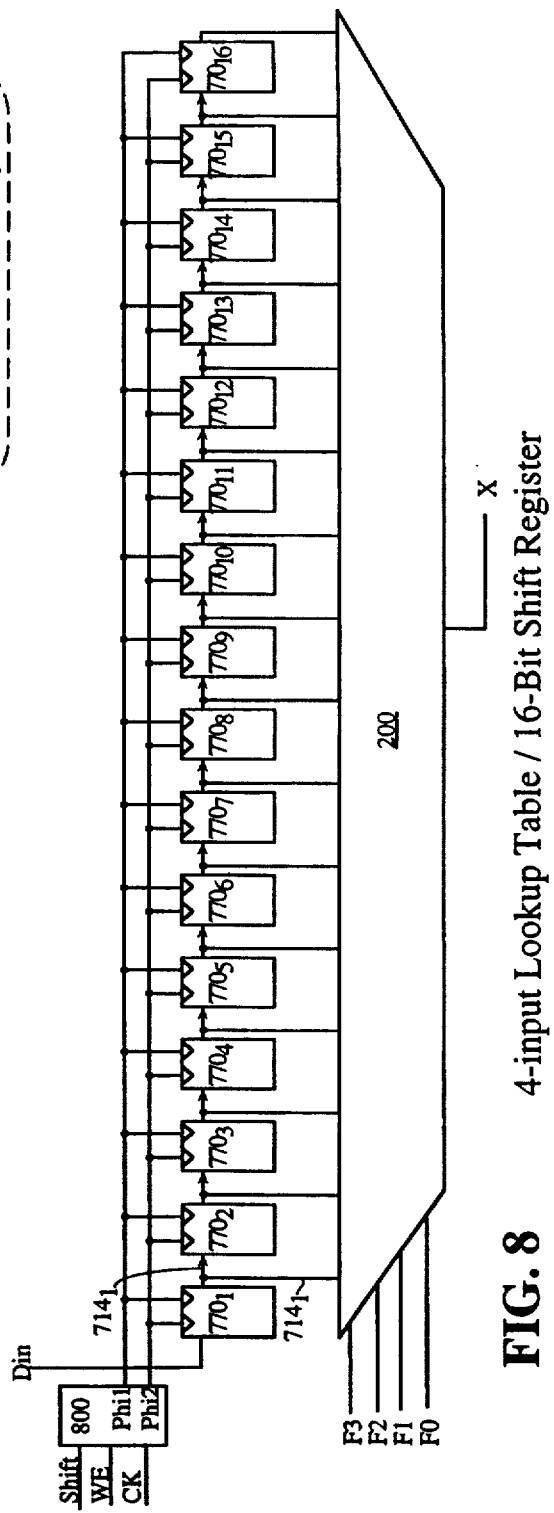
FIG. 8 4-input Lookup Table / 16-Bit Shift Register

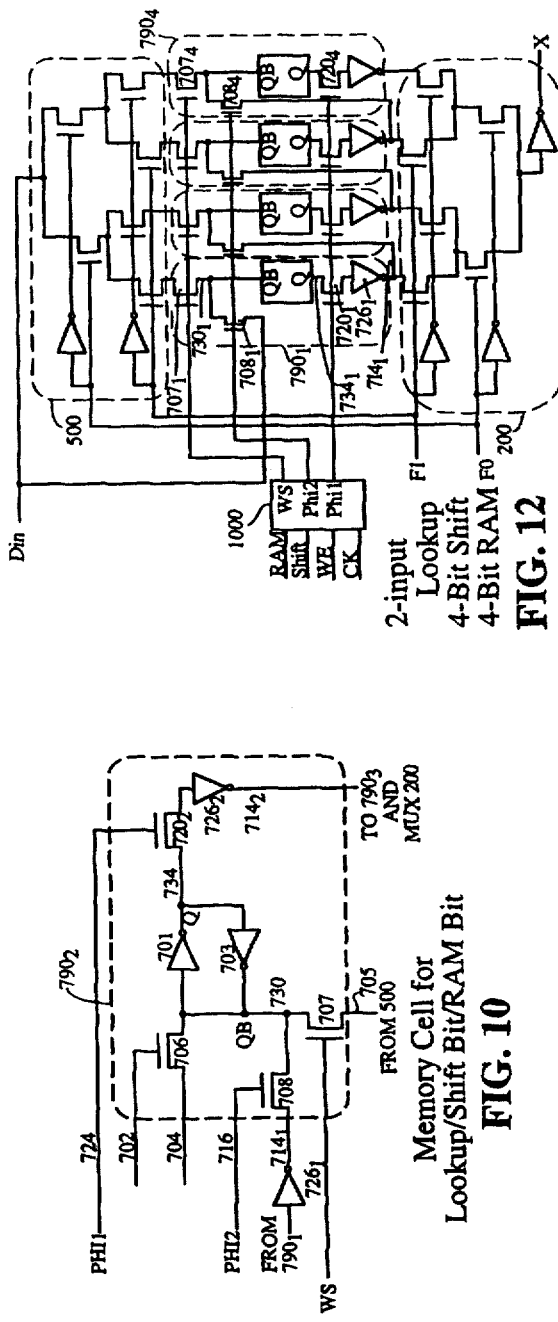
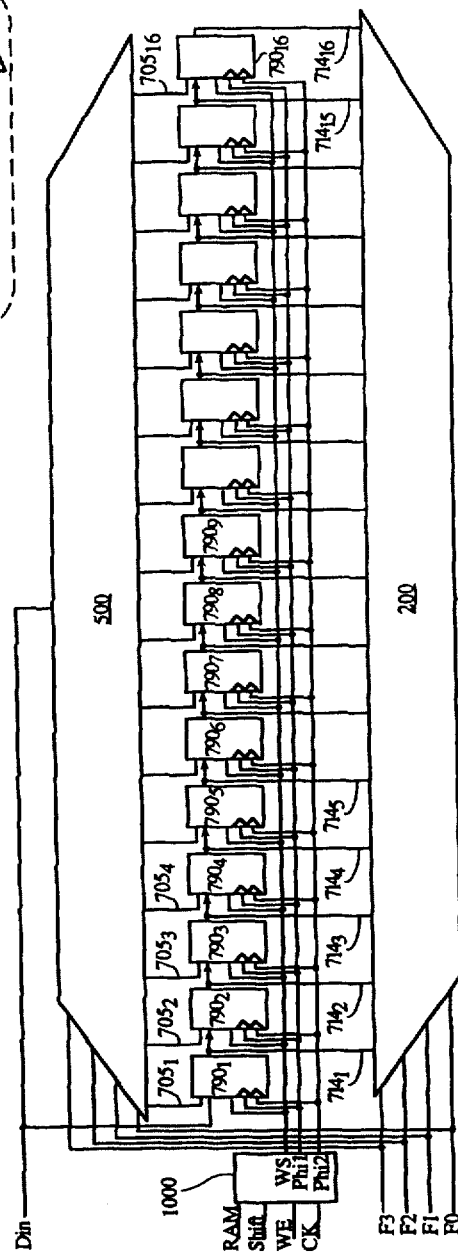
FIG. 12 2-input Lookup / 4-Bit Shift / 4-Bit RAM
FIG. 10 Memory Cell for Lookup/Shift Bit/RAM Bit
FIG. 11 4-input Lookup Table / 16-Bit Shift Register / 16-Bit RAM 64-Bit Variable Length Shift Register for FIFO FIG. 17  64-Bit Variable Length Shift Register for FIFO FIG. 18  Logic Slice for Variable Length Shift Register

FIG. 19  CLB Architecture

FIG. 20  CLB Architecture

FPGA ARCHITECTURE WITH DUAL-PORT DEEP LOOK-UP TABLE RAMS

RELATED APPLICATIONS

This application is a continuation-in-part of U.S. patent application Ser. No. [X-275-1P] 09/253,313 filed Feb. 18, 1999 which is a continuation in part of U.S. patent application Ser. No. 08/754,421, filed Nov. 22, 1996 now U.S. Pat. No. 5,889,413 content of which is incorporated herein by reference.

FIELD OF THE INVENTION

The present invention relates to an architecture for enabling random access memory (RAM) structures in configurable logic blocks (CLBs) of a field programmable gate array (FPGA).

BACKGROUND OF THE INVENTION

Xilinx, Inc. the assignee of the present application, manufactures FPGAs, the complexity of which continues to increase. Freeman in U.S. Pat. No. Reissue 34,363, incorporated herein by reference, which is a re-issue of original U.S. Pat. No. 4,870,302, describes the first FPGA. An FPGA is an integrated circuit chip which includes a plurality of programmable input/output pads, a plurality of configurable logic elements, and a programmable interconnect structure for interconnecting the plurality of logic elements and pads. Each logic element implements a logic function of the n inputs to the logic element according to how the logic element has been configured. Logic functions may use all n inputs to the logic element or may use only a subset thereof. A few of the possible logic functions that a logic element can be configured to implement are: AND, OR, XOR, NAND, NOR, XNOR and mixed combinations of these functions.

One disclosed implementation of the logic element includes a configurable lookup table which is internal to the logic element and which includes $2^n$ individual memory cells, where n is the number of input signals the lookup table can handle. At configuration, in this architecture a bitstream programs the individual memory cells of the lookup table with a desired function by writing the truth table of the desired function to the individual memory cells. Although the programming is described as being performed serially, other techniques for parallel programming are also known.

One memory cell architecture appropriate for use in the lookup tables is shown in FIG. 1 and described by Hsieh in U.S. Pat. No. 4,821,233, incorporated herein by reference. A memory cell of this architecture is programmed by applying the value to be written to the memory cell on the data input line, "Data," and strobing the corresponding address line, "ADDR." Further, although this architecture uses five transistors, other known configurations, e.g., six transistor static memory cells, also are appropriate choices for implementing the memory cells of the lookup table. As shown in FIG. 1, inverter 726 may be included to increase the drive of memory cell 700, and avoid effecting the value stored in memory cell 700 unintentionally via charge sharing with the read decoder.

After configuration, to use a lookup table, the input lines of the configured logic element act as address lines which select a corresponding memory cell in the lookup table. For example, a logic element configured to implement a two-input NAND gate would output the corresponding value {1,1,1,0} contained in the one of the four memory cells corresponding to the current input pair {00, 01, 10, 11}, respectively.

This selection is performed by a decoding multiplexer which selects a memory cell from the lookup table on the basis of the logic levels of the input lines. A block diagram of an exemplary four-input lookup table composed of 16 memory cells $700_1$ through $700_{16}$ and a decoding multiplexer 200 is shown in FIG. 2. The multiplexer propagates a value stored in one of the memory cells $700_1$–$700_{16}$ of the lookup table to an output X of the lookup table as selected by the four input signals F0–F3.

FIG. 3 is a schematic diagram of another embodiment of a lookup table. In this embodiment, the lookup table is implemented using four memory cells $700_1$–$700_4$ and a two-input decoding multiplexer 200 with two input signals, F0 and F1. The two-input decoding multiplexer 200 is shown in detail as being implemented by a hierarchy of pass transistors which propagate the value stored in the selected memory cell to the output X of the logic element. In FIG. 3, the memory cells may be implemented as shown in FIG. 1.

The above architecture was later augmented to enhance the functionality of the lookup tables. U.S. Pat. No. 5,343, 406 to Freeman et al., incorporated herein by reference, describes how additional circuitry can enable lookup tables to behave as random access memories (RAMs) which can be both read and written after configuration of the logic device. When the option of allowing the user to write data to memory cells is available, there also must be provision for entering the user's data into these memory cells and reading from the memory cells. This capability is provided by including two means for accessing each dual function memory cell, one which is used to supply the configuration bitstream from off the chip, and another which is used during operation to store values from signals that are routed from the interconnect Lines of the FPGA. FIG. 4 shows the memory cell architecture described in U.S. Pat. No. 5,343, 406 which allows memory cell 750 to be programmed both during and after configuration. During configuration, memory cell 750 is programmed using the same process for programming the memory cell of FIG. 1.

After configuration, memory cell 750 is programmed differently. A value to be written to memory cell 750 is applied through the interconnect structure of the FPGA to the second data line 705, and then the corresponding write-strobe line WS for the memory cell is pulsed. This pulse latches the value on line 705 into memory cell 750. Like the lookup table of FIG. 2 which uses a series of memory cells from FIG. 1, a series of memory cells from FIG. 4 are combinable into a lookup table.

FIG. 5 is a block diagram showing a four-input lookup table with synchronous write capability. There is a write strobe generator 504 which receives a clock signal, CK, and a write enable signal, WE, and creates a single write strobe signal, WS, for the lookup table. To write a value to a desired memory cell, say $750_5$, the value is applied on line $D_{in}$, and the address of the desired memory cell $750_5$ is applied to the input lines F0–F3 of demultiplexer 500. The value then is latched into the desired memory cell $750_5$ by pulsing the write strobe. Conversely, to read a value stored in a different desired memory cell $750_3$, the address of the memory cell $750_3$ is applied to the input lines F0–F3 of decoding multiplexer 200 (without pulsing the write strobe), as was described with reference to FIGS. 2 and 3.

FIG. 6 is a schematic illustration of a two-input lookup table with synchronous write capability. FIG. 6 includes four memory cells $750_1$, through $750_4$. Detail of demultiplexer 500 and multiplexer 200 is shown in FIG. 6.

The implementation and operation of other logic array devices are described in "The Programmable Logic Data Book," pages 4-1 to 4-372, copyright 1996 by Xilinx, available from Xilinx, Inc., 2100 Logic Drive, San Jose, Calif. 95124. This portion of "The Programmable Logic Data Book" is incorporated herein by reference.

Because a 4-input lookup table is only capable of storing 16-bits of data, it would be desirable to have an architecture that enables a plurality of lookup tables to be combined to from larger random access memories (RAMs) of selectable sizes. It would also be desirable if this architecture would enable dual-port RAMs of selectable sizes. It would further be desirable if this architecture did not significantly increase the complexity of the configurable logic elements (CLEs) in the FPGA.

One or more 4-input lookup tables, such as those illustrated in FIGS. 2 and 5, are typically used to implement combinatorial function generators in a configuration logic element (CLE). Some CLEs include a function generator to select between the outputs of two 4-input lookup tables in order to enable the CLE to implement any 5-input function. One such CLE, implemented in the Xilinx XC4000-Series FPGAs, is described in pages 4-11 through 4-23 of the Xilinx 1996 Data Book entitled "The Programmable Logic Data Book", available front Xilinx, Inc., 2100 Logic Drive, San Jose, Calif. 95224. The function generator can be replaced by a 2-to-1 multiplexer, with a signal selecting between the outputs of the two 4-input lookup tables, as disclosed in U.S. Pat. No. 5,349,250 entitled "Logic Structure and Circuit for Fast Carry" by Bernard J. New. Replacing the function generator with a 2-to-1 multiplexer still provides any function of up to five inputs and reduces the silicon area required to implement a the function generator. An FPGA using two 4-input lookup tables and a 2-to-1 multiplexer to implement a five input function generator is the XC5200™ family of products from Xilinx, Inc. The XC5200 CLE is described in pages 4-188 through 4-190 of the Xilinx 1996 Data Book.

A configurable logic block (CLB) capable of generating 6-input functions is described as implemented in the VIRTEX™ FPGAs from Xilinx Inc. This CLB includes two CLE slices, and is described in "The Programmable Logic Data Book 1999" pages 3-1 to 3-60, copyright 1999 by Xilinx, available from Xilinx, Inc., 2100 Logic Drive, San Jose, Calif. 95124.

It would be desirable to have a CLE structure that is capable of efficiently implementing functions larger than 6-input functions. It would further be desirable if this CLE structure is easily expandable, without significantly increasing the complexity of the CLE structure.

SUMMARY OF THE INVENTION

The present invention provides means and method for programming a configurable logic element so that the logic element can implement any one of a shift register and a combinatorial logic function using a lookup table. In one embodiment, the invention further provides for implementing a random access memory in this same logic element. The lookup table includes a plurality of memory cells which are connected in series so that an output of a first memory cell is configurable as an input to a second memory cell of the same lookup table. Further, by connecting shift registers of plural logic elements in series, larger shift registers can be built from smaller shift registers. Previous architectures built n-bit shift registers out of n flip flops connected in series, thereby wasting interconnect resources and logic while achieving mediocre performance.

In one mode, the memory cells which store the lookup table values are used as registers in a shift chain. When the logic element is in shift register mode, the Data-in value is shifted into the first cell and the value in each memory cell is, shifted to the next cell. When the logic element is in random access memory mode, the Data-in value is written to a cell addressed by F3–F0, as discussed above. When the logic element is in pure lookup table mode, no value can be written after configuration and the logic element continues to generate the function loaded in during configuration.

According to another aspect of the invention, shift registers formed in a single lookup table can be cascaded together through cascade multiplexers to form larger shift registers. Each cascade multiplexer receives two input signals, the output signal from the last memory cell in a previous lookup table, and an input signal from the interconnect :structure (or other selectable source). The output signal from the cascade multiplexer provides the input signal to the first memory cell in the next lookup table.

According to yet another aspect of the invention, a hierarchy of multiplexers is provided to generate functions of more inputs than the lookup table can handle. For example, a lookup table having 16 memory cells can generate functions of four input signals. By combining the outputs of two lookup tables in a multiplexer (F5) controlled by a fifth input signal, any function of five input signals can be generated. Using a sixth signal to select between the outputs of two such F5 multiplexers allows any function of six input signals to be generated, and so forth. In one embodiment, a configurable logic block (CLB) includes four slices, each having two four-input lookup tables (a total of eight lookup tables). The multiplexer hierarchy allows for all functions of eight input signals to be generated by selecting the output signal of one of the 16 lookup tables in a pair of CLBs. In addition to the eight lookup tables that generate functions of four input signals, the CLB includes four F5 multiplexers, where each F5 multiplexer receives input signals from two lookup tables and can generate all functions of give input signals when the two lookup tables receive the same four input signals and the F5 multiplexer is controlled by the fifth input signal. The CLB also includes two F6 multiplexers where each F6 multiplexer receives input signals from two of the F5 multiplexers. The CLB further includes an F7 multiplexer which receives the two F6 signals. The CLB also includes an F8 multiplexer which receives the F7 multiplexer output signal and an F7 multiplexer output signal from an adjacent CLB.

In one embodiment, this hierarchy of eight multiplexers is controlled by the same lines that provide shift register input signals. In this embodiment, the eight lookup tables are paired into 4 slices so that the downstream lookup table in each slice receives a shift register input signal on the line that also controls the F5 multiplexer for the slice. The upstream lookup table of the slice receives a shift register input signal on the line that controls an F6, F7 or F8 multiplexer. This arrangement is advantageous because the structure can be configured as a variable length shift register, where the line carrying the most upstream signal is used for loading shift register data and the more downstream lines all control multiplexers.

In accordance with another embodiment of the present invention, the plurality of function generators (lookup tables) present in the CLB are configured to form a random access memory (RAM). The width and depth of the RAM are selectable by controlling the routing of signals within the CLE slices. The hierarchy of multiplexers (e.g., the F5, F6, F7 multiplexers) are used to selectively route read data values from the lookup tables.

Another set of multiplexers is used to selectively route write data values to the lookup tables. These multiplexers can be configured to provide a single write data value to all of the lookup tables to form a deep RAM. Alternatively, these multiplexers can be configured to provide one write data value to half of the lookup tables, and another write data value to the other half of the lookup tables. This pattern repeats down to the level where these multiplexers can be configured to provide a different write data value to each of the lookup tables. Advantageously, each of the CLE slices includes the same multiplexer pattern, and each lookup table is accompanied by a corresponding multiplexer.

A write control circuit is also provided in each CLE slice to provide write enable signals to the lookup tables in the CLE slice. Each write control circuit generates the write enable signals in response to a plurality of write control signals received from various CLE slices. This advantageously enables the generation of many different patterns of write enable signals. Advantageously, each of the CLE slices includes an identical write control circuit.

Dedicated routing resources are provided to enable read and write addresses to be provided to the CLE slices in a manner that enables the CLB to be operated as a dual-port RAM having selectable width and depth.

The present invention will be more fully understood in view of the following description and drawings.

BRIEF DESCRIPTION OF THE DRAWINGS

FIG. 4 is a schematic illustration of a second prior art memory cell architecture used in lookup tables where the value of the memory cell is stored at configuration and remains dynamically readable and writable after configuration.

FIG. 5 is a block diagram of a prior art logic element that is configurable to implement either a sixteen-by-one random access memory or a four-input lookup table.

FIG. 6 is a schematic illustration of a prior art logic element that is configurable to implement either a four-bit random access memory or a two-input lookup table.

FIG. 7 is a schematic illustration of a memory cell architecture according to the present invention which can alternatively be configured as a shift register or a lookup table.

FIG. 8 is a block diagram of a logic element according to the invention that can implement either a four-input lookup table or a 16-bit shift register.

FIG. 9 is a circuit diagram of a logic element according to the invention that can implement either a 2-input lookup table or a 4-bit shift register, where the mode of the logic element controls the operation of the control logic, and may be stored in configuration memory.

FIG. 10 is a schematic illustration of a memory cell for implementing any of a lookup table, a shift register, or a RAM.

FIG. 11 is a block diagram of a logic element that is configurable to implement any one of a four-input lookup table, a sixteen-bit shift register, and a sixteen-bit random access memory.

FIG. 12 is a schematic diagram of a logic element according to the present invention that is configurable to implement any one of a two-input lookup table, a four-bit shift register, and a four-bit random access memory.

FIGS. 13A through 13H shows waveform diagrams of the operation of the logic element when configured in shift-register mode.

DETAILED DESCRIPTION

With an increase in logic gate density, a shift register can now be implemented as one element of a larger user-configurable integrated circuit logic array. In a first embodiment of the present invention, a logic element is configurable to implement both an n-bit shift register and a ($\log_2$ n)-input lookup table. FIG. 7 shows a schematic illustration of a memory cell $770_2$ of the logic element architecture according to the present invention which, when configured to be in shift register mode, advantageously enables a value to be shifted from a preceding memory cell $770_1$ into the memory cell $770_2$. Memory cell $770_2$ includes a pass transistor 706. The configuration value is written into memory cell $770_2$ by pulsing configuration control line 702 of transistor 706, while applying the configuration value to the data line 704.

Figure 3:
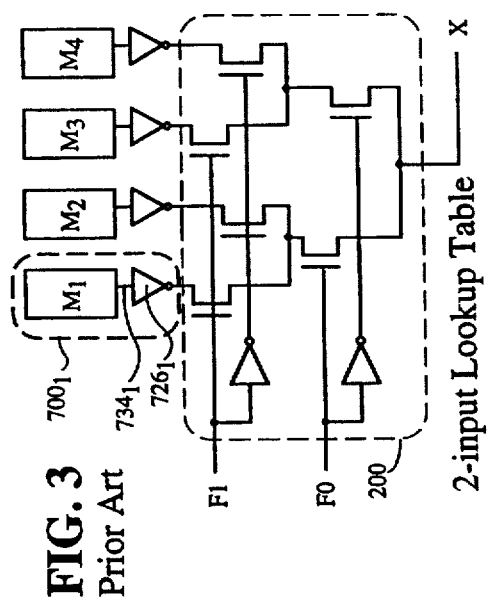
FIG. 3 is an expanded view of a schematic illustration of a prior art two-input lookup table and a decoding multiplexer implemented by a hierarchy of pass gates.
Figure 1:
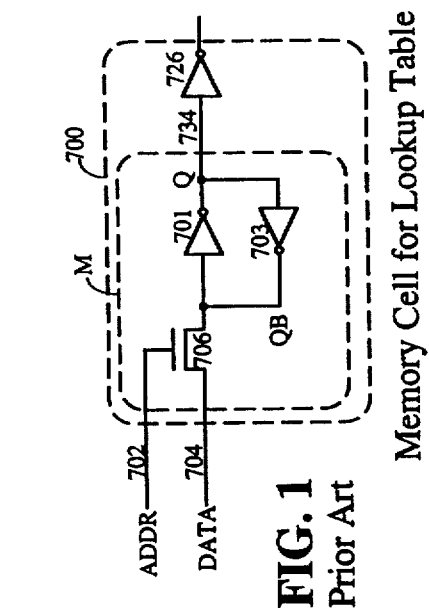
FIG. 1 is a schematic illustration of a first prior art memory cell architecture used in lookup tables in FPGAs where a value of the memory cell is stored during configuration.
Figure 2:
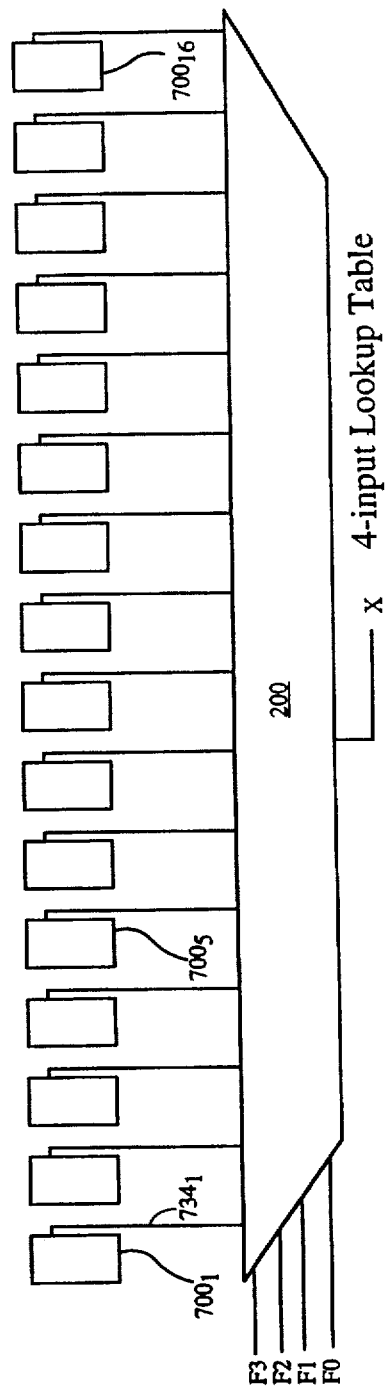
FIG. 2 is a block diagram of a prior art programmable 4-input look-up table implemented by a sixteen-to-one decoding multiplexer and a series of sixteen memory cells.
Figures 7A, 7B:
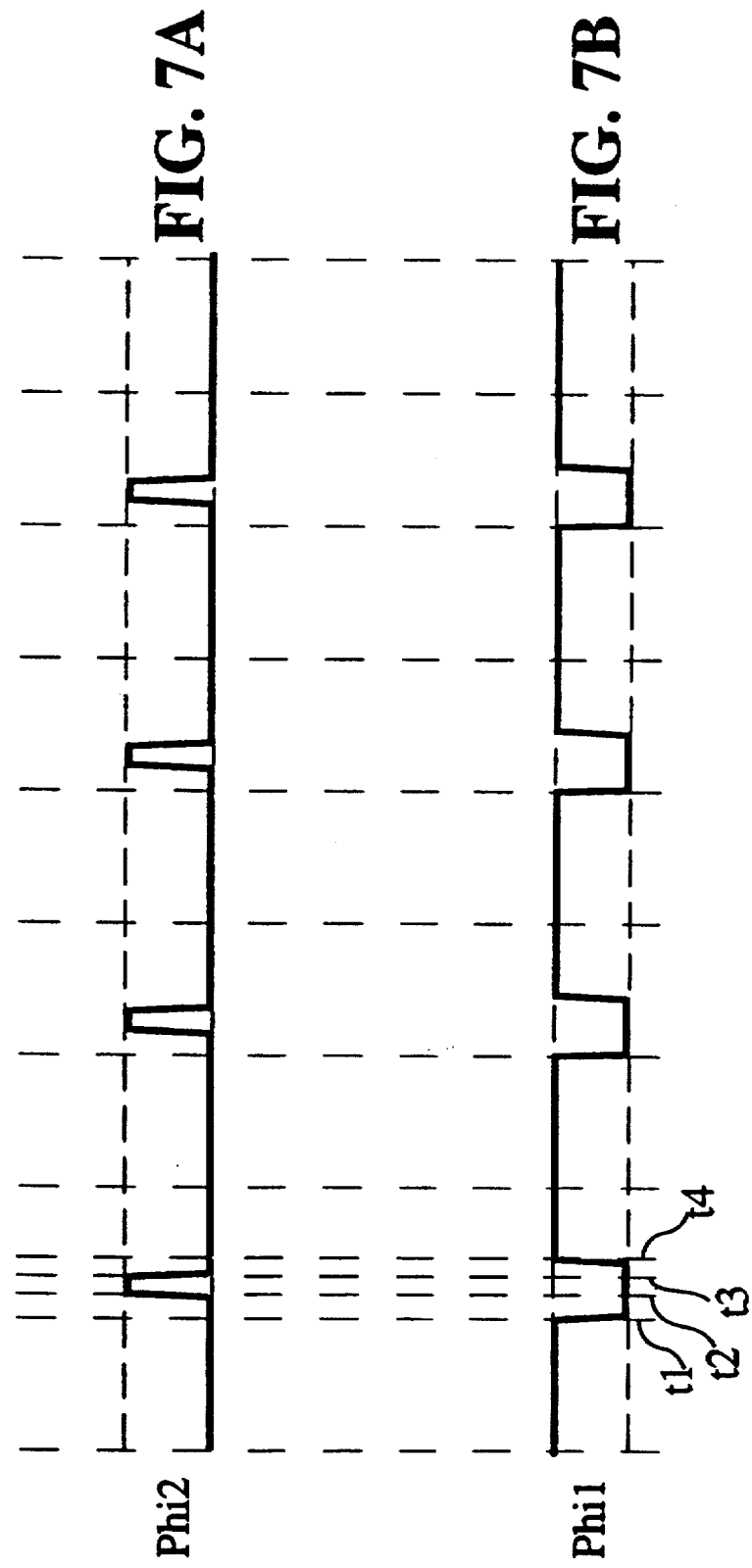
FIGS. 7A and 7B are waveform diagrams showing non-overlapping signals Phi1 and Phi2 which cause a bit value to shift from a preceding memory cell into the current memory cell when Phi2 is asserted.

The output of memory cell $770_2$ is programmably connected to the input of a next memory cell $770_3$ by pass transistors $720_2$, inverted $726_2$, and a next pass transistor $708_3$ not shown in FIG. 7. As shown by the timing diagrams in FIGS. 7A and 7B, during most of each cycle the clocking signal Phi1 on output control line 724 remains high, and thus the output signal $734_2$ of memory cell $770_2$ is applied through inverter $726_2$ to shift input line $714_2$ leading to the next memory cell $770_3$. When Phi1 goes low at time t1, pass transistor $720_2$ is turned off. Inverter $726_2$ continues for a short time to hold as an output signal the logic level previously asserted by memory cell $770_2$. In this way, the combination of transistor $720_2$ and inverter $726_2$ serves as a temporary latch. When a second clocking signal, Phi2, is asserted at time t2 on input control line 716, inverter 701 receives both the output of inverter 703 of memory cell $770_2$ and the output of inverter $726_1$ of the previous memory cell $770_1$. Each inverter 726 is designed to overpower the inverter 703 so that values can be shifted between adjacent memory cells. Therefore, the current value stored in memory cell $770_2$ is overwritten by the output of the previous memory cell $770_1$. When Phi2 returns low at time t3, memory cell $770_2$ is once again latched, holding its current value independent of changes in shift input line $714_1$. At time t4, Phi1 goes high, thus applying the new value to inverter $726_2$. Thus in one clock cycle, a bit shifts on cell. In contrast, if Phi1 and Phi2 mistakenly overlapped, the value of the output 734 of each memory cell 770 would propagate from preceding memory cell 700, through memory cell $770_2$ to the next memory cell $770_3$. This would not produce the desired single bit shift. However, by using non-overlapping two-phase clocking, as shown in FIGS. 7A and 7B, the memory cells shift one bit per cycle of Phi1 and Phi2.

FIG. 8 shows a logic element which implements a 16-bit shift register and 4-input lookup table according to a first embodiment of the invention. For simplicity, in FIG. 8 the structures within memory cells 770 of FIG. 7 have not been explicitly illustrated.

In FIG. 8, when in shift register mode, a first memory cell $770_1$ of the memory is programmed with an initial value. The memory cell's value may be over written with a new value by applying the new value to the $D_{in}$ terminal of the first memory cell $770_1$ and strobing the clock line, CK. The strobing of CK in turn invokes the two-phase clocking cycle of FIGS. 7A and 7B. As data is moved synchronously from left to right in the shift register, i.e., from the first memory cell $700_1$ to a last memory cell $700_{16}$, the logic element can continue to act as a lookup table though the function charges with every clock cycle. As in the prior art lookup tables, the decoding multiplexer 200 outputs on output line X the contents of the memory cell selected by the user inputs, i.e., F0–F3.

FIG. 9 shows a structure for implementing a 2-input lookup table or a 4-bit shift register, and shows internal structure of multiplexer 200 and memory cells $770_1$ through $770_4$. FIG. 9 is oriented on the page the same way as FIG. 8, and thus assists in understanding the relationship between the elements that make up the lookup table/shift register embodiment.

In a second embodiment of the present invention, a logic element is configurable to implement an n-bit shift register, an n-bit random access memory, and a ($\log_2$ n)-input lookup table. FIGS. 10–12 illustrate this embodiment. FIG. 10 illustrates the memory cell. The memory cell of FIG. 10 can be loaded from three different sources. During configuration, memory cell $790_2$ is loaded by applying configuration data to line 704 and strobing control line 702 of transistor 706.

When memory cell $790_2$ is in shift register mode, it is loaded through transistor 708, as discussed above. When memory cell $790_2$ is in RAM mode, it is loaded through demultiplexer 500 on line $705_2$. Write strobe line WS is pulsed, turning on transistor 707, and thus applying a data signal to node 730.

FIG. 11 shows a logic element which implements any one of a 16-bit shift register, a 16-bit random access memory, and 4-input lookup table according to the second embodiment of the present invention. In this embodiment, a memory cell, say $790_5$, of the lookup table is programmed with an initial value during configuration, as discussed above. Subsequently, the initial value may be replaced in either of two ways, depending on the mode of the logic element: shift or RAM.

When the lookup table including memory cells 790 is being used in RAM mode, each memory cell 790 receives its data input on RAM input line 705. To write to any memory cell 790, the write strobe line WS pulses, thereby driving the value of Din through demultiplexer 500 into the addressed memory cell via input line 730.

The operation of the logic element in each of these modes is controlled by control logic 1000. Control bits which specify whether the logic element is in RAM mode, shift mode, or neither are inputs to control logic unit 1000. Control logic unit 1000 also receives the user clock signal and the write enable signal. From these inputs, control logic unit 1000 outputs Phi1, Phi2 and write strobe signal WS to either shift data between memory cells, to write to a particular memory cell, or to leave the memory cell data untouched. When in shift register mode, as in FIG. 8, data is moved synchronously from left to right in the shift register, i.e., from the first memory cell $790_1$ to a last memory cell $790_{16}$, as described above, by invoking a two-phase clocking cycle when CK is strobed. On the other hand, when the logic element is configured as a random access memory (RAM), the addressing lines F0–F3 select one of the memory cells ($790_1$ through $790_{16}$) to be written to and read from by using the demultiplexer 500 and the decoding multiplexer 200, respectively. When in shift register mode, the first memory cell $790_1$ receives as its input the signal applied to line $D_{in}$. When in RAM mode, memory cell $790_1$ receives an input signal on line $705_1$ from demultiplexer 500.

In RAM mode, to write to a given memory cell, say $790_5$, the write enable line WE must be active. When the user clock signal CK is asserted in conjunction with the active WE signal, control logic unit 1000 generates a write strobe WS. When the write strobe WS is high, memory cell $790_5$ addressed by address lines F0–F3 of the demultiplexer 500 receives the value from data input line $D_{in}$. This value overwrites the previous contents of the memory cell $790_5$. No other memory cells receive the value applied to $D_{in}$ since they are not addressed and therefore separated from $D_{in}$ by high impedance connections from the demultiplexer 500.

FIG. 12 is a schematic illustration which shows more detail of a logic element according to the second embodiment of the present invention. Collectively, demultiplexer 500, decoding multiplexer 200, pass transistors 708 and 720, inverters 726, and RAM mode pass transistors 707 form an interconnection network and are combined with memory cells ( $790_1$ through $790_4$) and control logic unit 1000 to implement the logic element according to the second embodiment. If the logic element of the second embodiment is not configured as a shift register, then the logic element acts as either a random access memory or a lookup table. In either non-shift register mode, Phi2 is maintained at a low level, deactivating pass transistors 708, thereby blocking data from one memory cell $790_i$ from affecting the next memory cell $790_{i+1}$. Also, in the non-shift register modes, Phi1 is maintained at a high logic level, thereby feeding the outputs of the memory cells ($790_1$ to $790_4$) through to the decoding multiplexer 200. As before, the output of the logic element is selected by the decoding multiplexer 200 according to the user inputs F0 and F1.

When the logic element of FIG. 12 is configured as a shift register, the RAM mode pass transistors 707 are turned off because WS is held low, isolating the memory cells from the outputs of demultiplexer 500. Memory cell $790_1$ is programmably connected to $D_{in}$ through transistor $708_1$. To shift values, control logic unit 1000 produces control signals Phi1 and Phi2, triggered while the write enable signal is active by a rising edge of the User Clock signal CK applied to control logic unit 1000 such that values are shifted from one memory cell to next memory cell, i.e., from memory cell $790_{i-1}$ to memory cell $790_i$, and from memory cell $790_i$ to memory cell $790_{i+1}$. When control logic unit 1000 receives a rising edge of the user clock signal, control logic unit 1000 first pulls Phi1 low, then pulses Phi2 high long enough to overwrite the contents of the memory cells ($790_1$ to $790_4$, and lastly reasserts Phi1 after Phi2 has fallen. It is important for extremely low clocking frequencies that Phi2 be only a pulse since Phi1 must be off while Phi2 is on. To accomplish this, the control logic is designed so that Phi1 and Phi2 do not rely on the falling edge of the User Clock signal 1008, but rather are self-timed.

Figure 13:
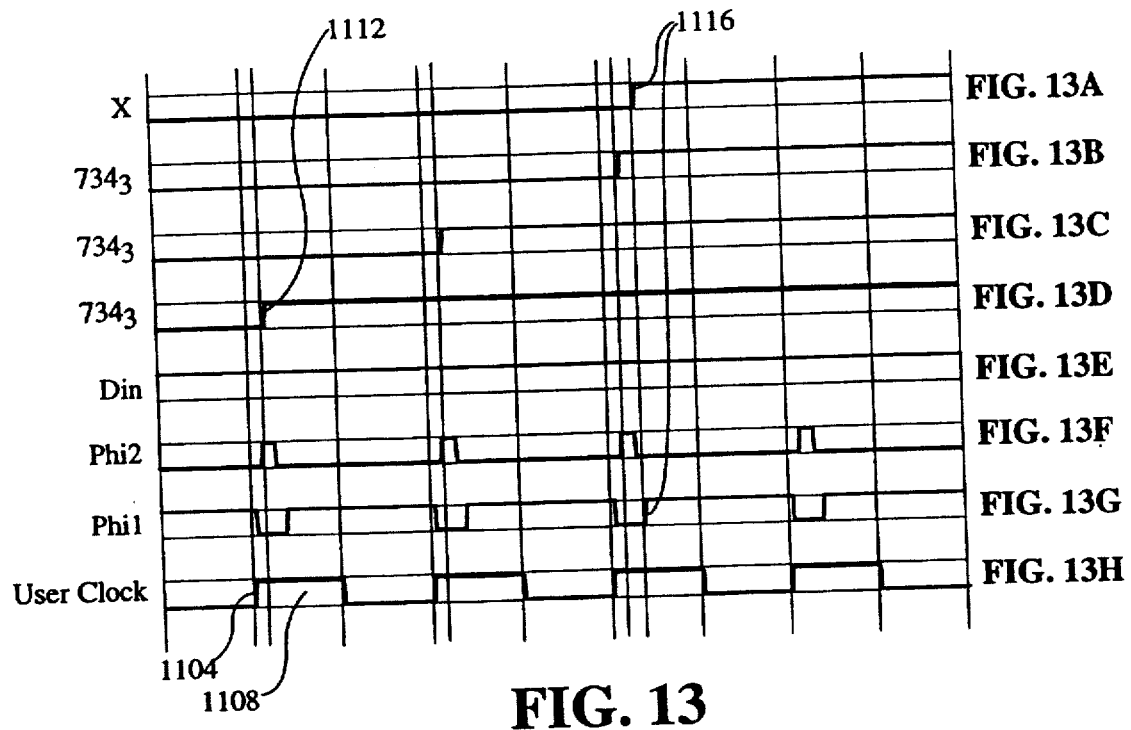
FIG. 13 comprising

FIG. 13 comprising FIGS. 13A through 13H are waveform diagrams of the operation of the logic element of FIG. 12,. When the logic element of FIG. 12 is configured in shift-register mode, setting F1 to 1 and F0 to 0 makes it function as a three-bit shift register. As shown in FIG. 13E, the input, $D_{in}$, to the three-bit shift register is maintained continuously at a high logic level throughout the example. Upon receiving a rising edge 1104 of a first user clock pulse 1108, control logic unit 1000 pulls Phi1 to a low logic level, as shown in FIG. 13G, to deactivate pass transistors 720 (FIG. 12). After temporarily having isolated the outputs $734_1$ through $734_4$ of the memory cells ($790_1$ through $790_4$) from inputs of inverters $726_1$ through $726_4$, the control logic unit 1000 asserts Phi2, which propagates outputs of inverters $726_1$ through $726_4$ to their corresponding next memory cells, i.e., memory cells $790_2$ through $790_4$. When Phi2 is asserted, the value on $D_{in}$ is written to first memory cell $790_1$. The non-overlapping Phi2 pulse is shown in FIG. 13F. As shown in FIG. 13D, the value stored in first memory cell $790_1$ (corresponding to $734_1$) changes shortly after Phi2 is asserted. This change is indicated by reference 1112. The new value of output $734_1$ of the first memory cell $790_1$ does not affect the second memory cell $790_2$ (corresponding to $734_2$) because Phi1 is temporarily inactive. After asserting Phi2 long enough for the memory cells ($790_1$ to $790_4$) to reach their new states, Phi2 is lowered, thereby latching the data values. Only after Phi2 has been lowered does control logic unit 1000 raise Phi1.

On receiving the rising edge of Phi1, the values of outputs $734_1$ through $734_4$ again pass through pass transistors $720_1$ through $720_4$. Reference numeral 1116 shows that the change in the output X of the three-bit shift register is synchronized with the rising edge of Phi1. As seen in FIGS. 13G and 13H, the reassertion of Phi1 and the lowering of the User Clock are independent, thus logic designers need not depend on exact timing relationships between these two edges. Of course, Phi1 must be reasserted before the inputs of inverters $726_1$ through $726_4$ float to an invalid voltage.

Figure 14:
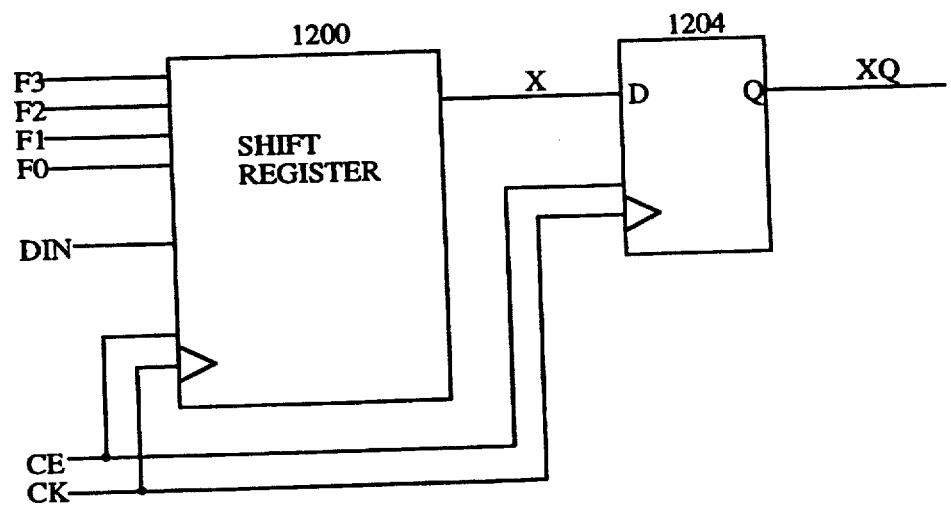
FIG. 14 is a block diagram of a logic element which includes both a shift register and a flip-flop.

FIG. 14 is a block diagram of a logic element which includes both a logic element 1200 and a flip-flop 1204. The purpose of the flip-flop is to improve the clock-to-out delay of the output of the logic element 1200. This is simple and efficient in Xilinx FPGAs because function generators are historically paired with flip-flops in Xilinx logic elements. Further, when an n-bit, synchronous shift register is required, the logic element can be configured so that the shift register 1200 is an (n−1)-bit shift register and flip-flop 1204 is the final register of the n-bit shift register. When configured in this alternative fashion, the final bit XQ is available upon the rising edge 1104 of the User Clock pulse 1108, rather than on the rising edge 1116 of Phi1. This provides a faster clock-to-out time for the overall n-bit shift register.

By configuring the logic element to route XQ back to $D_{in}$, the present invention can also perform circular shifts.

As discussed above (FIGS. 13A–13H), a shift register having fewer stages than the number of memory cells in a lookup table can be formed by directing a bit other than the last bit to output terminal X. Lookup tables likewise may be cascaded to create shift registers of a greater size than supported by a single lookup table. For example, it is possible to create a 20-bit shift register in a logic array composed of 16-bit lookup tables by cascading two logic elements. A first full 16-bit shift register 1200 and a second full 16-bit shift register 1200 combine to produce a 32-bit shift register. Thus, to achieve a 20-bit shift register, user input lines F0–F3 of the first logic element are set to 1111 and user input lines F0–F3 of the second logic element are 0011, i.e., the second 16-bit shift register 1200 is programmed to pass the output of the fourth memory cell $790_4$, which is the final output of the 20-bit shift register. Additionally, in order to improve the clock-to-out delay of the cascaded shift registers, an alternate embodiment uses a first full 16-bit shift register 1200 addressed to 1111, a second full 16-bit shift register 1200 addressed to 0010 and the flip-flop 1204. The output, X, of the second shift register feeds the input of flip-flop 1204 of the second shift register. If desired, the flip-flops 1204 can also be used to extend the number bits that can be shifted within a logic element. Fully utilizing both 16-bit shift registers 1200 and their flip-flops 1204, cascaded shift registers can be built which are 17-bit, 34-bit, 51-bit, etc.

Figure 15:
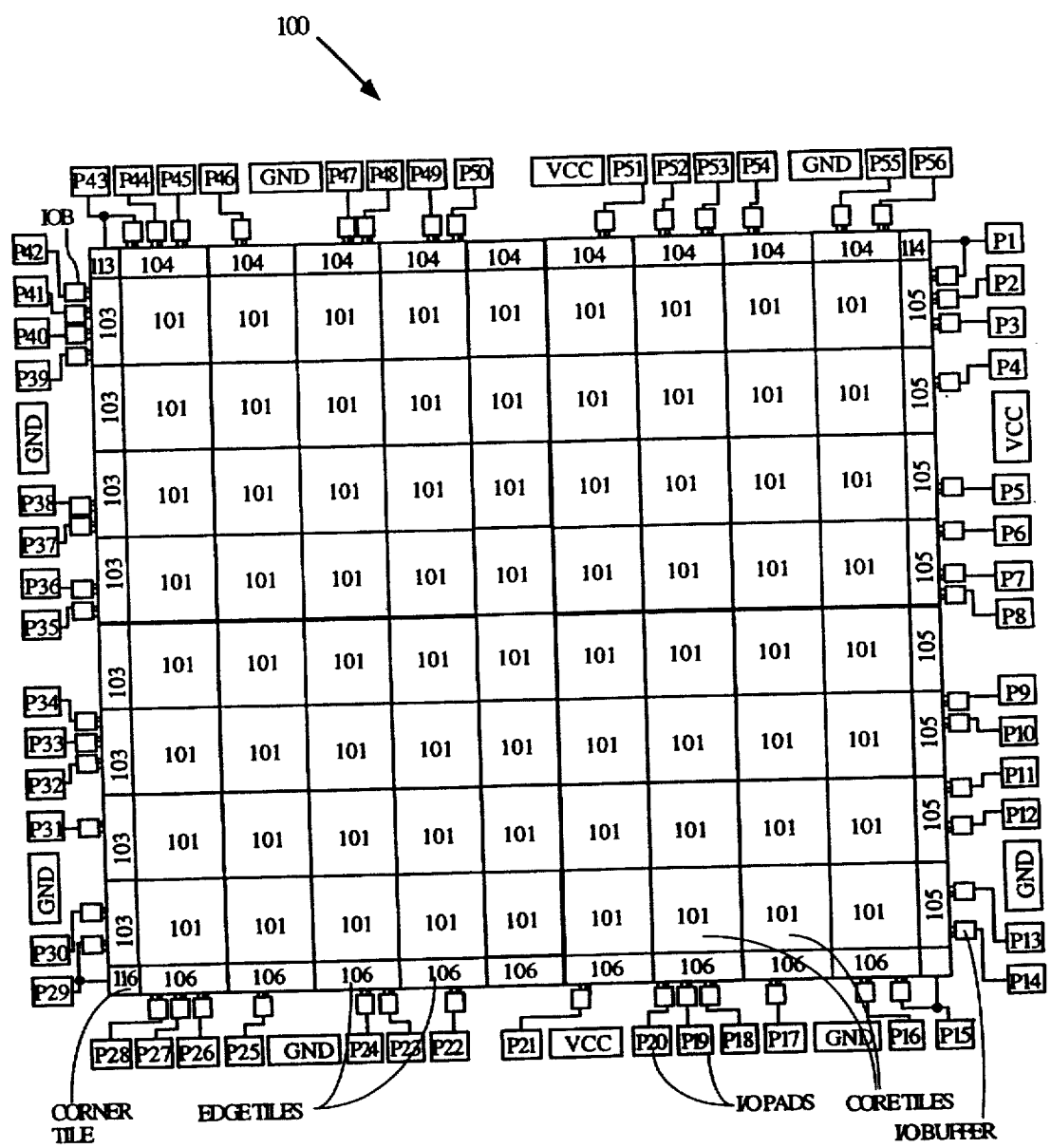
FIG. 15 is a block diagram of an FPGA.

The novel shift register logic element is typically implemented in an FPGA such as the FPGA of FIG. 15 having logic blocks 101, each comprising a portion of an interconnect structure and a logic element. The FPGA of FIG. 15 is further discussed by Tavana et al. in the application Ser. No. 08/618,445 incorporated herein by reference.

Figure 16:
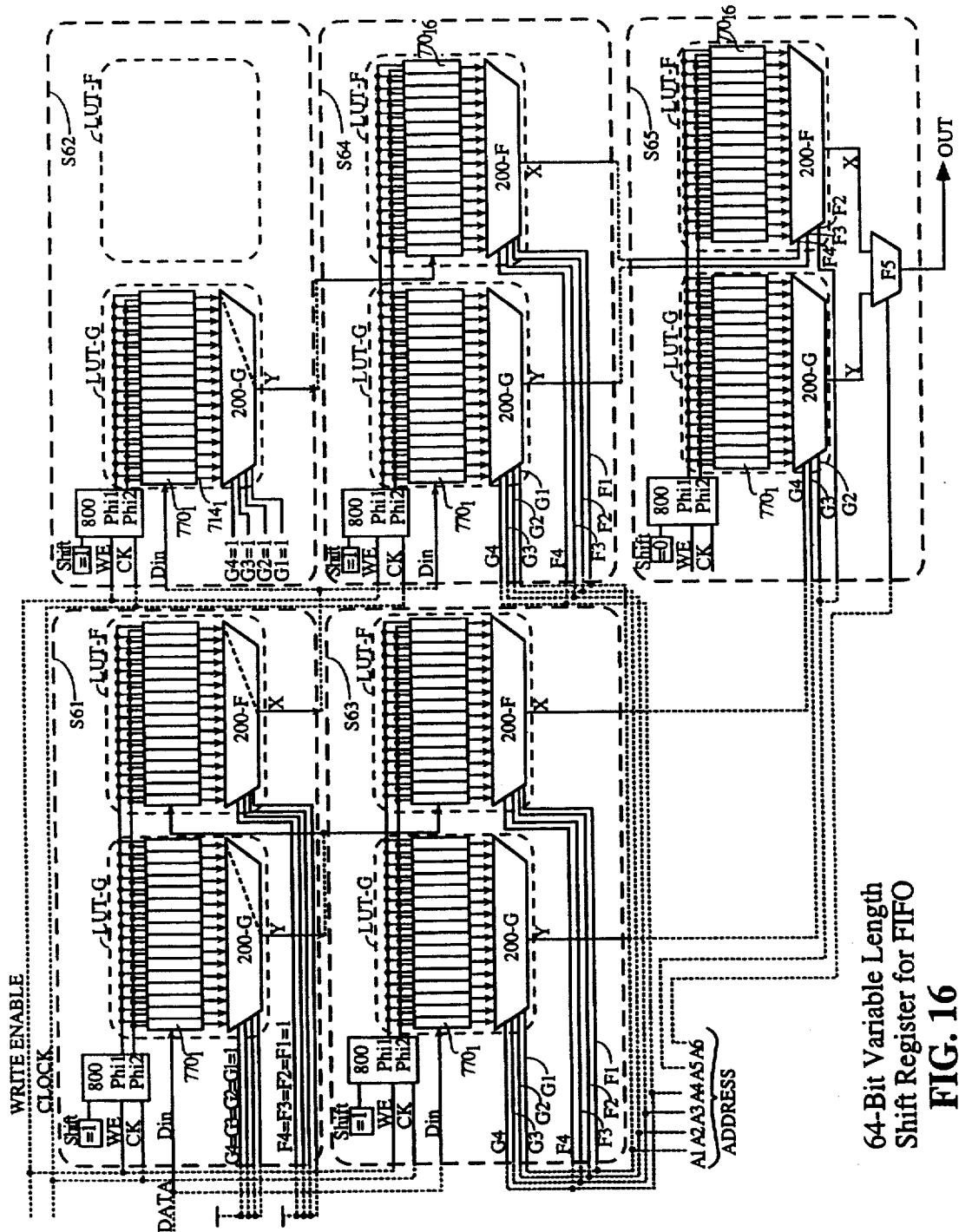
FIG. 16 shows a 64-bit variable length shift register formed by combining structures such as shown in FIG. 8.

FIG. 16 shows a 64-bit variable length shift register formed by combining structures such as shown in FIG. 8. Variable length shift registers are desired when building FIFOs (first-in-first-out storage devices).

Conventional FIFOs are commonly composed of a block of RAM addressed by READ and WRITE pointers which each increment through the block and cycle to the bottom upon reaching the top. When a word is written (pushed) into the FIFO, it is written to the address pointed to by the WRITE pointer, and the WRITE pointer is then incremented to point to the next address. When a word is read (popped) from the FIFO, it is taken from the address pointed to by the READ pointer and the READ pointer is incremented to the next address. Thus the data in a RAM based FIFO are never shifted. Rather, the READ and WRITE pointers are incremented independently.

In the present case using a shift register, whenever a WRITE command is received, data are always written to one location in a shift register and all other data are shifted one step through the shift register. In response to a WRITE command, a READ pointer is incremented. In response to a READ command, the READ pointer is decremented. There is no WRITE pointer. (The READ address represents the end of the string of stored data.) Such a shift register can be used to implement a variable length FIFO. If a shift register FIFO is desired that is no more than 16 words deep, then such a FIFO can be built in an FPGA using only one lookup table configured as a shift register for each bit of the word to be stored. If a FIFO is desired that can store more than 16 words, a structure such as shown in FIG. 16 must be built for each bit of the word. For example, a 64-word FIFO with 8-bit words would require 8 of the structures shown in FIG. 16. The structure of FIG. 16 can store up to 64 bits, the DATA bits being written from the left on data input line Din and being read out on the line OUT.

However, because the architecture of FIG. 8 provides only a single output from each LUT, (outputs are labeled X and Y), it is necessary to duplicate the data, an upper bank being used to store data for writing to subsequent lookup tables, and a lower bank being used for providing the particular data bit that has been addressed during a READ operation. A long shift register requires that the last sequential bit ($770_{16}$) of each 16-bit shift register be shifted to the first bit of the subsequent shift register, and that every bit be addressable by the READ address applied to the LUT output multiplexers 200. (If the FIFO is nearly empty, the READ address points to a memory cell near the left of the picture, for example cell $770_1$ of LUT-G of slice S63. If the FIFO is nearly full, the READ address points to a memory cell near the right of the picture, for example cell $770_{16}$ of LUT-F of slice S64.) Data bits are routed from one slice to another using the general interconnect routing lines. (These lines are illustrated using dotted lines to indicate that they are programmably connectable and to distinguish from the routing lines that are part of the slice itself.)

Using the architecture of FIG. 8, five slices S1 through S5 are used. A slice includes two lookup tables LUT-F and LUT-G, each comprising 16 memory cells $770_1$ through $770_{16}$, a multiplexer 200-F or 200-G, four LUT input lines F1 through F4 or G1 through G4 and a LUT output line X or Y. The slice also includes a clocking structure 800 receiving write enable signal WE, clock input signal CK, and a shift control signal from, for example, a configuration memory cell. Clocking structure 800 generates two non-overlapping clocking signals Phi1 and Phi2, as discussed earlier (See FIGS. 7A and 7B). These clocking signals Phi1 and Phi2 operate to shift bits to the right in response to clock signal CK when the shift memory cell contains a logic 1 and when the write enable signal WE is logic 1. In order to provide that the last bit $770_{16}$ of lookup table LUT-G of slice S61 is fed to lookup table LUT-F of slice S63, while simultaneously allowing an addressed bit to be read from any of four lookup tables (two in slice S63 and two in slice S64 ), it is necessary to duplicate three of the four lookup tables and to configure the lookup tables so that in one lookup table the last bit is always routed out through multiplexer 200-F or 200-G to the first bit of the next shift register, and in the duplicate lookup table, the addressed bit is read. Thus, the addressed bit is read from the addressed lookup tables LUT-G of slice S63, LUT-F of slice S63, LUT-G of slice S64, or LUT-F of slice S64 while the last bit of lookup table LUT-G of slice S61, LUT-F of slice S61, or LUT-G of slice S62 is shifted in to the first bit of lookup table LUT-F of slice S63, LUT-G of slice S64 of LUT-F of slice S64, respectively, regardless of which address is being read out. Since lookup table LUT-F of slice S64 is the last in the chain, it is not necessary to form a duplicate in lookup table LUT-F of slice S62. (Recall that the data stored in slice S61 is identical to the data stored in slice S63, and the data stored in LUT-G of slice S62 is identical to the data stored in LUT-G of slice S64.)

As another aspect of the particular architecture of FIG. 8, discussed by Young, Chaudhary, and Bauer in pending U.S. patent application Ser. No. 08/806,997 the content of which is incorporated herein by reference, multiplexers are included for generating five (F5) and six (F6) input functions by combining the outputs of the four-input lookup tables LUT-F and LUT-G. But in that described embodiment, the same input signal that feeds the Din signal also serves as the control signal on the F5 multiplexer. Thus, it is not possible to use an address signal for controlling the F5 multiplexer when also using that signal for supplying data. Thus a fifth slice S65 is used. The LUT-F and LUT-G lookup tables and an F5 multiplexer of slice S65 are configured to implement a four-to-one multiplexer, the output signal from this multiplexer being the addressed bit.

Figure 17:
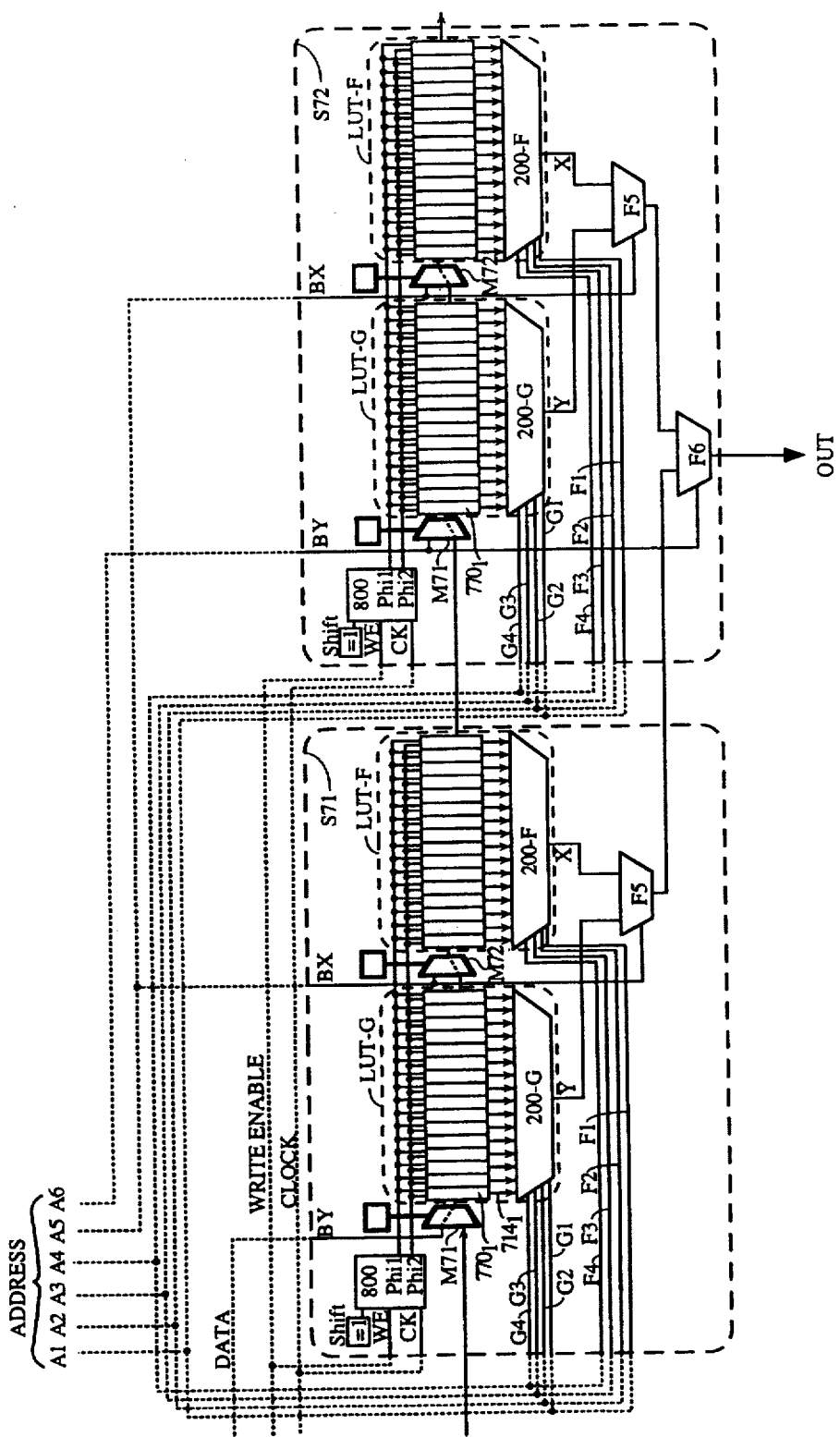
FIG. 17 shows a 64-bit variable length shift register formed using an architecture with an advantageous modification to the structure of FIG. 8.

FIG. 17 shows a 64-bit variable length shift register formed using an architecture with an advantageous modification to the structure of FIG. 8. By changing the architecture to add a two-to-one multiplexer to the data input of each shift register and feeding the output signal of the last memory cell of the previous shift register to that multiplexer (in addition to the signal from the interconnect structure that exists in FIG. 8), a variable length shift register can be formed using no more than half the number of lookup tables of FIG. 16. The structure of FIG. 17 is configured as a 64-bit variable length shift register, just as is the structure of FIG. 16. But since the structure of FIG. 17 includes multiplexers M71 and M72 as inputs to the respective lookup table shift registers, each lookup table has both a variable-tap output through multiplexer 200 and a fixed output from cell $770_{16}$. This is advantageous for making a FIFO because each lookup table now has the two outputs required when cascading together logic elements to build a long variable-tap shift register, so no duplication of logic is required. And the READ address dynamically addresses one of the 64 memory cells via the four lookup table input signals and the F5 and F6 multiplexers. Note that using the shift input of the newly added multiplexer M71 or M72 allows the BY or BX input of the newly added multiplexer to be used for another function, in this case controlling an F5 or F6 multiplexer.

Figure 18:
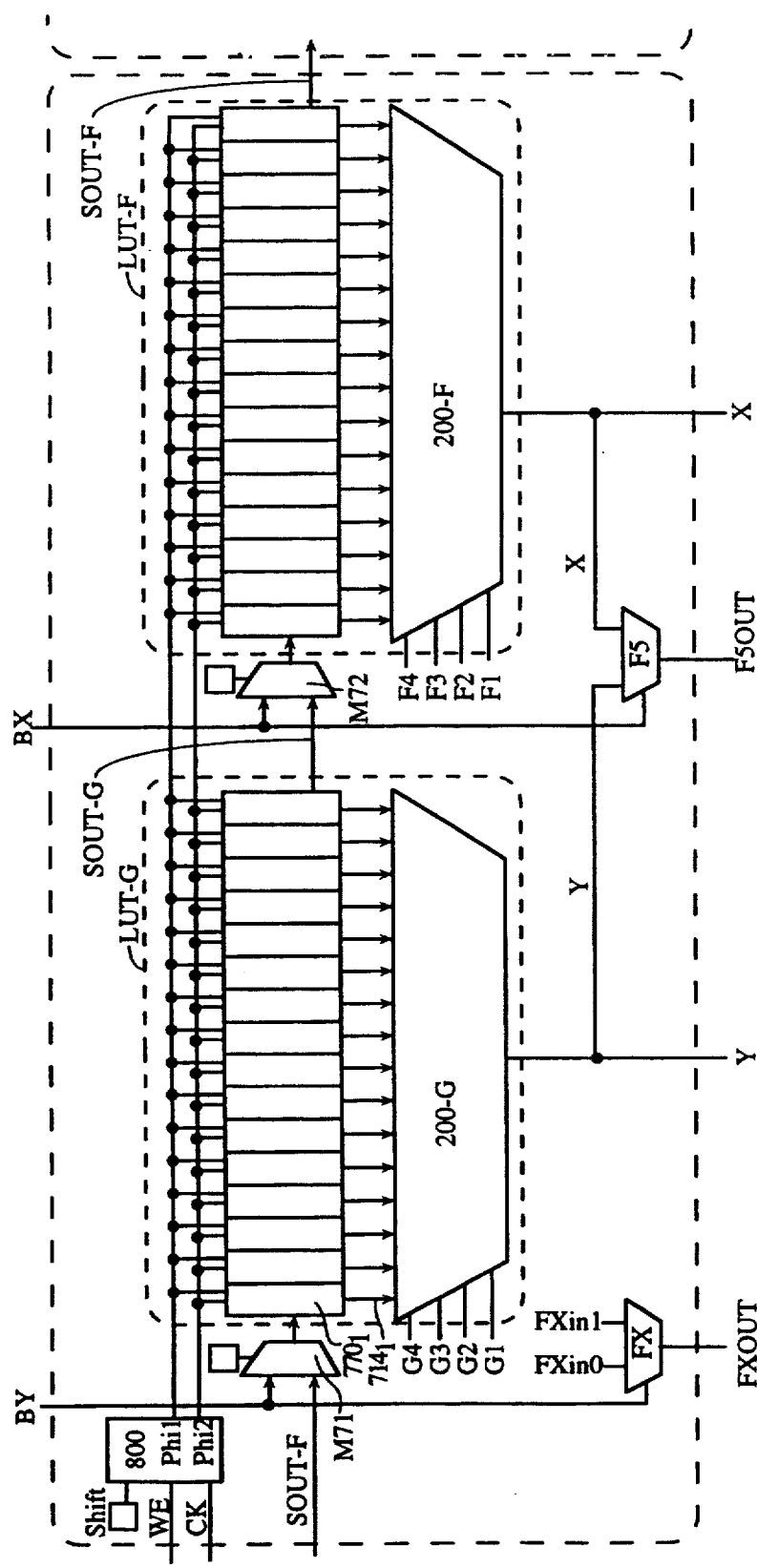
FIG. 18 shows a logic slice structure from which the 64-bit variable length shift register of FIG. 17 can be formed.

FIG. 18 shows a logic slice structure from which the 64-bit variable length shift register of FIG. 17 can be formed, and in particular shows connections of the F5 multiplexer and another multiplexer labeled FX. A preferred architecture combines four of these slices into one configurable logic block (CLB). The FX multiplexer can be an F6, F7, or F8 multiplexer, depending upon the position of the illustrated slice in the CLB, where an F6 multiplexer selects between outputs of two F5 multiplexers, an F7 multiplexer selects from two F6 multiplexers, and an F8 multiplexer selects from two F7 multiplexers. FIG. 18 illustrates that the BX input signal goes two places: to multiplexer M72 and to the control terminal of the F5 multiplexer. Similarly, the BY input signal goes to multiplexer M71 and to the control terminal of the FX multiplexer. Note that the input signals to the FX multiplexer are labeled FXin0 and FXin1. These input signals come from other F5 or FX multiplexers within the CLB, and hey are most conveniently illustrated in FIG. 19. In a preferred embodiment, a logic slice structure such as that of FIG. 18 will include additional elements, for example flip flops, fast carry circuits, and routing structures (see, for example, U.S. Pat. No. 5,267,187 to Hsieh et al., and U. S. Pat. No. 5,349,250 to New, as well as U.S. patent application Ser. No. 03/806,997 referenced above). However, to avoid obscuring the present invention, these additional structures have not been shown here.

Figure 19:
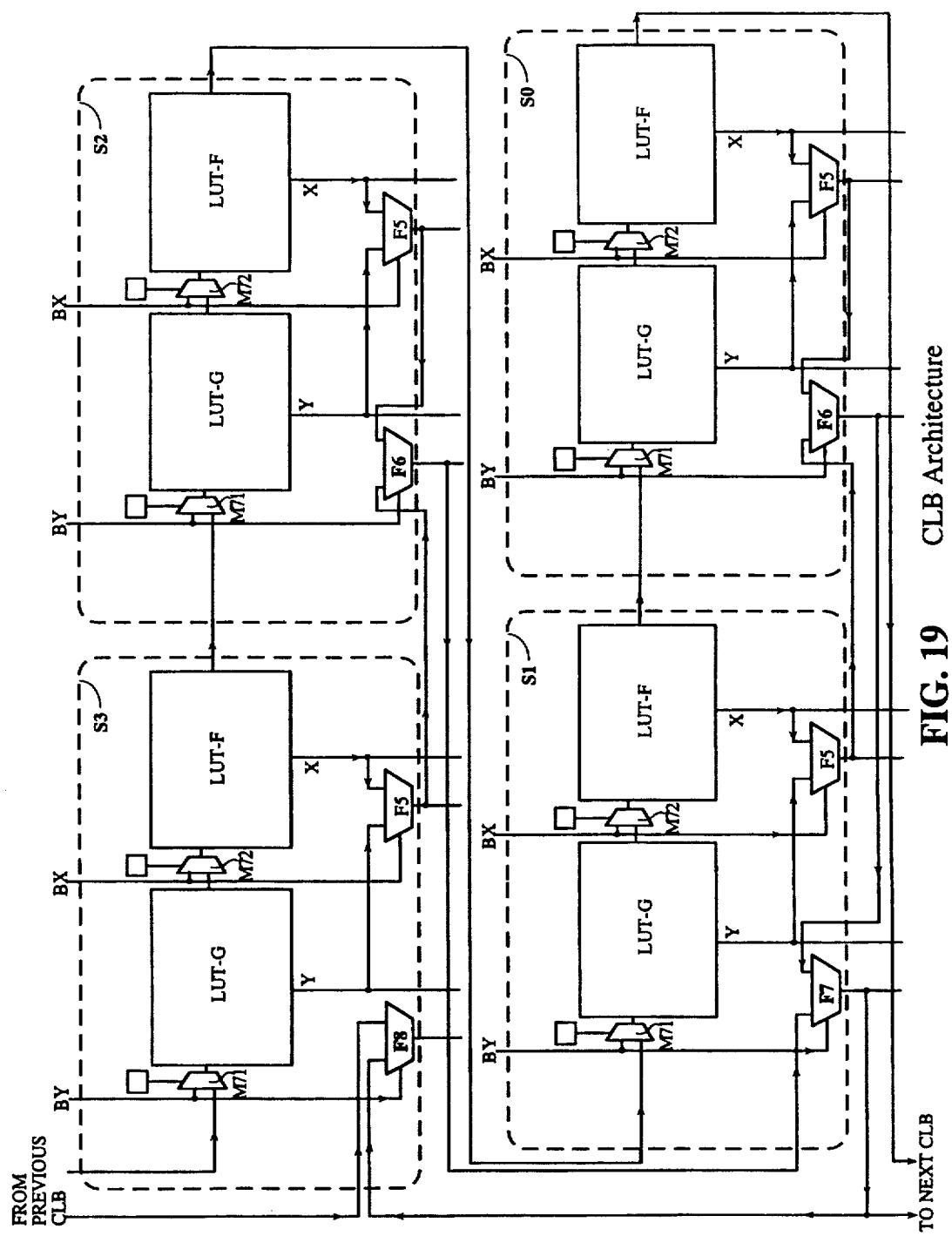
FIG. 19 shows a layout of wiring for cascading adjacent lookup table slices by which interiors of adjacent lookup table slices can be identically laid out.

FIG. 19 shows a layout of wiring for cascading adjacent lookup table slices by which interiors of adjacent lookup table slices can be identically laid out and by which a single input line BX or BY can serve a function in an earlier architecture as well as a new function discussed here (so the new architecture discussed here can implement designs that have been implemented in the previous architecture illustrated in FIG. 16). FIG. 19 illustrates one configurable Logic block (CLB) comprising four slices, each having two lookup tables (LUTs). Each slice is equivalent to that of FIG. 18. Whereas FIG. 18 shows one F5 multiplexer and one FX multiplexer (in addition to the two M71 and M72 multiplexers discussed earlier), FIG. 19 shows the different interconnections to the FX multiplexer in different parts of one CLB. These wide function multiplexers are now labeled F6, F7, and F8 to show the number of input signals they can provide all function of. Thus, the F8 multiplexer selects from the output signals of two F7 multiplexers and an F7 multiplexer selects from two F6 multiplexers and so on. The lookup tables themselves provide all functions of four input signals. Note that the F8 multiplexer receives one input signal from the F7 multiplexer of its own CLB and another input signal from the F7 multiplexer of an adjacent CLB. Note also that one CLB includes four F5 multiplexers, two F6 multiplexers, one F7 multiplexer, and one F8 multiplexer.

The novel and advantageous placement of these wide function multiplexers always allows the control signal BX or BY to serve the dual function of providing shift-in data and controlling a corresponding multiplexer. This is because only one of the BX or BY terminals will be used for shifting in data to a shift register, and the sharing is arranged so that the highest order multiplexer is placed at the beginning of the shift register for that length. In the case of a 64-bit shift register, two slices will be used (see FIG. 17). The address will be six bits long and will use two F5 multiplexers and one F6 multiplexer. Looking at FIG. 19, this can be accomplished in either the upper two slices S3 and S2 or in the lower two slices S1 and S0. In either case, data will be shifted in on line BY of slice S3 or S1, and multiplexer M71 of the slice will be set to receive the BY signal. The F7 or F8 multiplexer will not be used since the desired output signal is provided by the F6 multiplexer of slice S2 or S0. Thus there is no conflict that the line used for controlling the F7 or F8 multiplexer is used in this case as a data input line to the shift register.

If a 128-bit shift register is desired, the entire CLB of FIG. 19 will be used. Data will be shifted in on the BY line of slice S3 and the output signal will be taken from the F7 multiplexer. The F8 multiplexer will not be used. Thus, again, there is no conflict in the fact that the line used for controlling multiplexer F8 is used to provide data to the shift register. Similarly, if a 256-bit shift register is desired, two CLBs of the type shown in FIG. 19 will be used, data being shifted in to the upper of the two CLBs and the output signal taken from the F8 multiplexer of the lower CLB. So again there is no conflict. Knowing this relationship, architectures can be provided having longer patterns of multiplexers for providing larger functions. All this is possible because for n-input lookup tables we need (n−1) lines for controlling multiplexers and 1 line for shifting in data to a shift register. The (n−1) multiplexer control signals plus 1 data-in signal exactly match the n lines provided.

Shift registers of sizes other than powers of two can also be formed by combining the appropriate number of slices. For example, if a user wanted a 200-bit variable length shift register, this could be implemented in seven slices using 13 LUTs, seven F5 multiplexers, four F6 multiplexers, two F7 multiplexers, and one F8 multiplexer. The three LUTs not needed in the eight slices that feed the F8 multiplexer could be used for other functions. To avoid generating an erroneous output signal if one of the unused lookup tables is addressed, the control inputs for the F5 and F6 multiplexers associated with partially used slices are preferably tied to a constant value.

Figure 20:
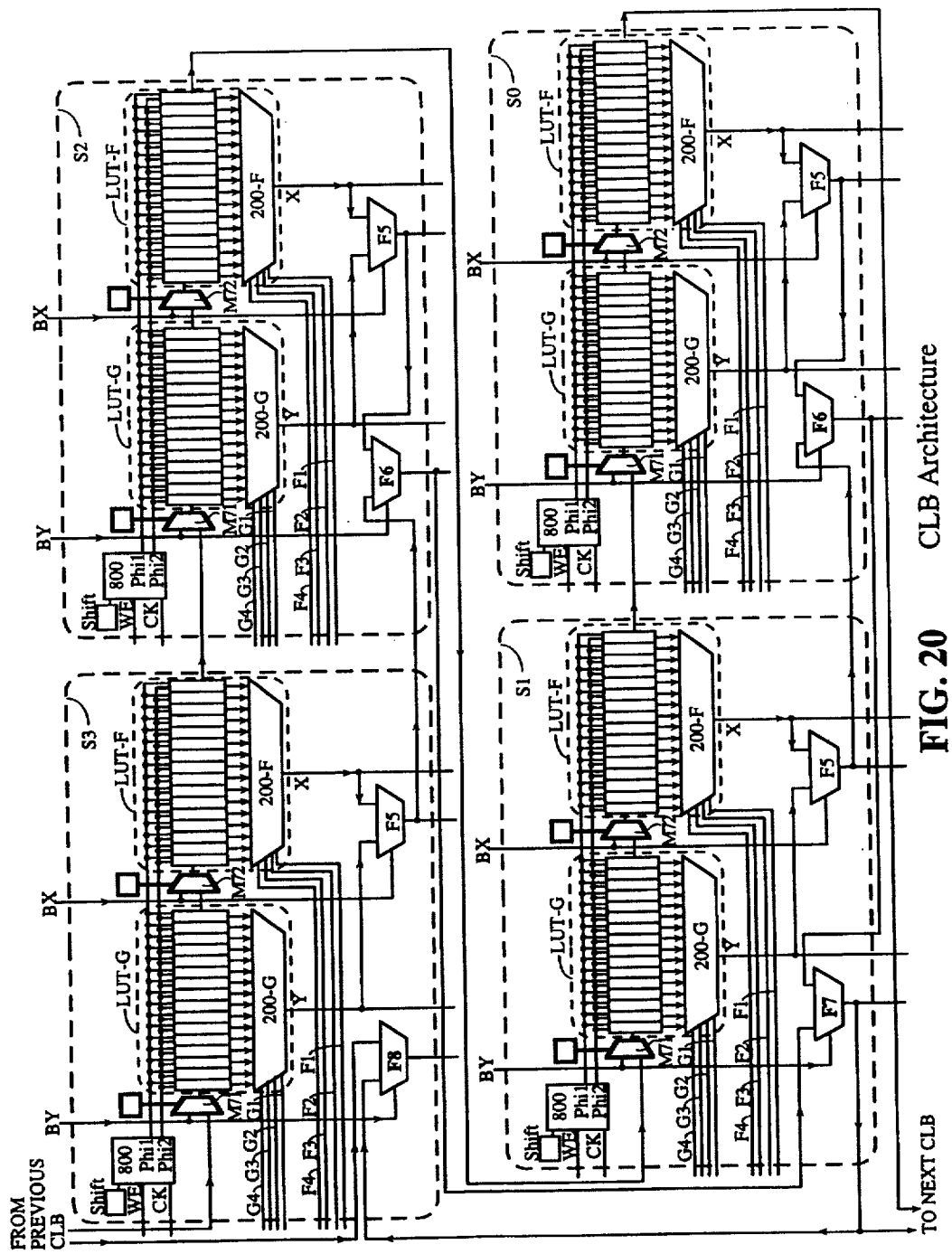
FIG. 20 shows more detail of the structure of FIG. 19, illustrating the lookup table structures.

FIG. 20 shows more detail of the structure of FIG. 19, illustrating the lookup table structures and clocking structures discussed earlier. Since the additional details of FIG. 20 have been discussed earlier, they are not discussed again here.

Figure 21:
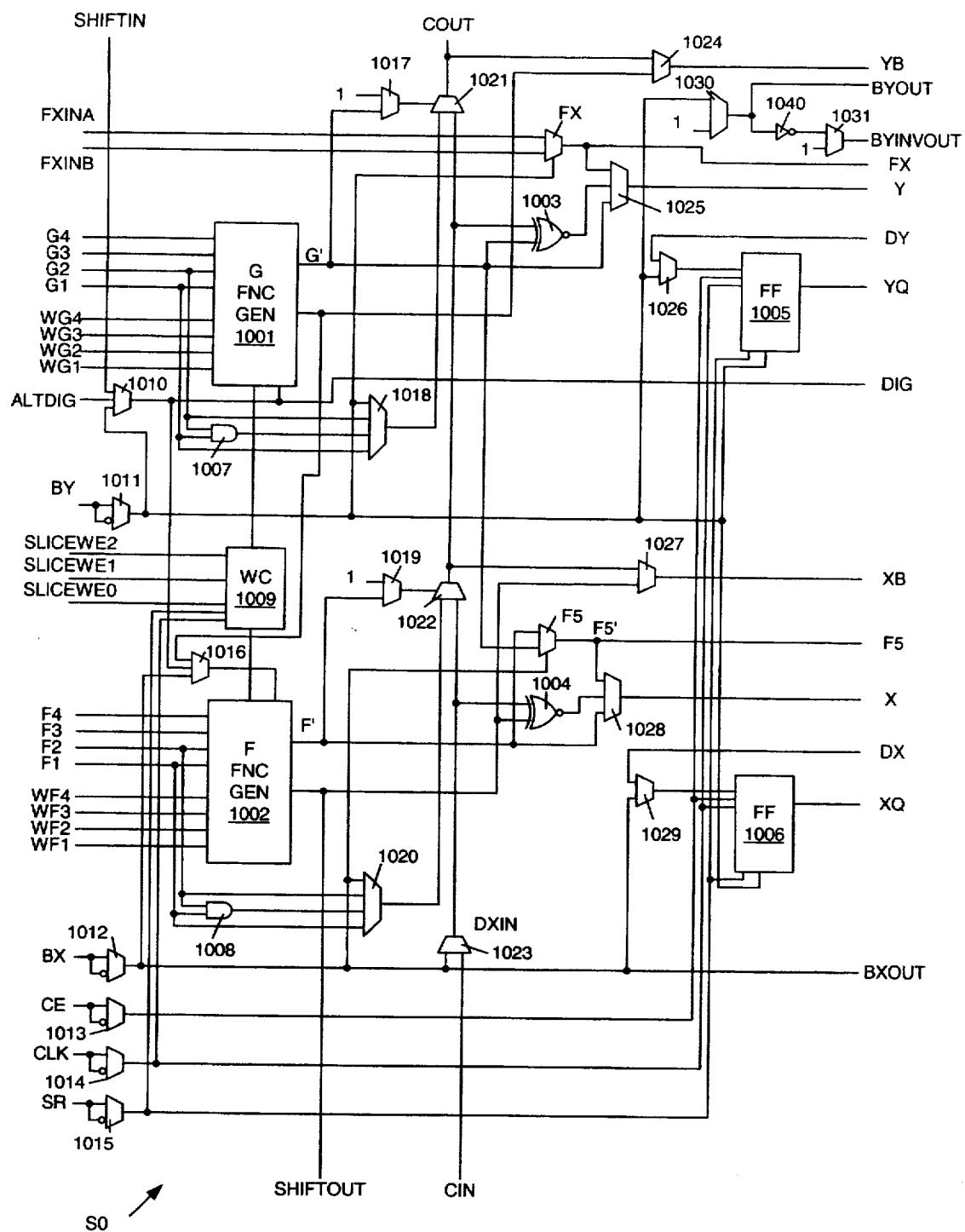
FIG. 21 is a schematic diagram of a CLE slice S0 in accordance with one embodiment of the present invention.

FIG. 21 is a schematic diagram of CLE slice S0 in accordance with one embodiment of the present invention. CLE slice S0 includes G and F function generators 1001 and 1002, exclusive OR gates 1003–1004, D-Q flip flops 1005–1006, AND gates 1007–1008, write control logic 1009, multiplexers 1010–1031, inverter 1040, and multiplexers F5 and FX. Slice S0 includes shift register circuitry consistent with that described above. The shift input data (e.g., SHIFTIN or BY) is provided to G function generator 1001 by multiplexer 1010. Data is shifted out of G function generator 1001 to multiplexer 1016. Note that multiplexer 1016 is also coupled to the output terminals of multiplexers 1010 and 1012. Data is shifted into F function generator 1002 from multiplexer 1016. Data is then shifted out of F function generator 1002 as the SHIFTOUT signal. Write control circuit 1009 controls the writing of data values to G and F function generators 1001 and 1002. Multiplexers 1010–1031 are configured to control the routing of the various signals in slice S0.

F function generator 1002 can be configured to implement a 4-input lookup table that provides an output signal F' that is any function of the input signals F4–F1. The output signal F' is routed to an input terminal of multiplexer F5. G function generator 1001 can be configured to implement a 4-input lookup table that provides an output signal G' that is any function of the input signals G4–G1. The output signal G' is routed to another input terminal of multiplexer F5. Multiplexer F5 is controlled by the bypass signal BX (or BX#, which is the inverse of BX). By routing the signals F1–F4 to the four input terminals of the G function generator 1001, multiplexer F5 can be used to provide an output signal F5' that can be any function of the five input signals F4–F1 and BX.

The output signal G' is also routed to an input terminal of multiplexer 1025. In accordance with the described embodiment, Multiplexer 1025 is configured to route the output signal G' as the output signal Y.

Multiplexer FX is a 2-to-1 multiplexer having two input terminals coupled to receive the FXA and FXB input signals, which are provided by the general interconnect located outside of CLE slice S0. Multiplexer FX is controlled by the bypass signal BY (or BY#, which is the inverse of BY). As described in more detail below, multiplexer FX is capable of operating as any multiplexer wider than an F5 multiplexer (i.e., F6, F7, F8, F9, F10, etc.), depending on the configuration of the CLE slice in a larger CLB circuit. These wider multiplexers are capable of providing any function of greater numbers of input signals. Thus, an F6 multiplexer is capable of providing any function of up to six input signals, and an F10 multiplexer is capable of providing any function of up to ten input signals. In the CLB circuit described below in connection with FIG. 22, the largest FX multiplexer is an F8 multiplexer.

Figure 22:
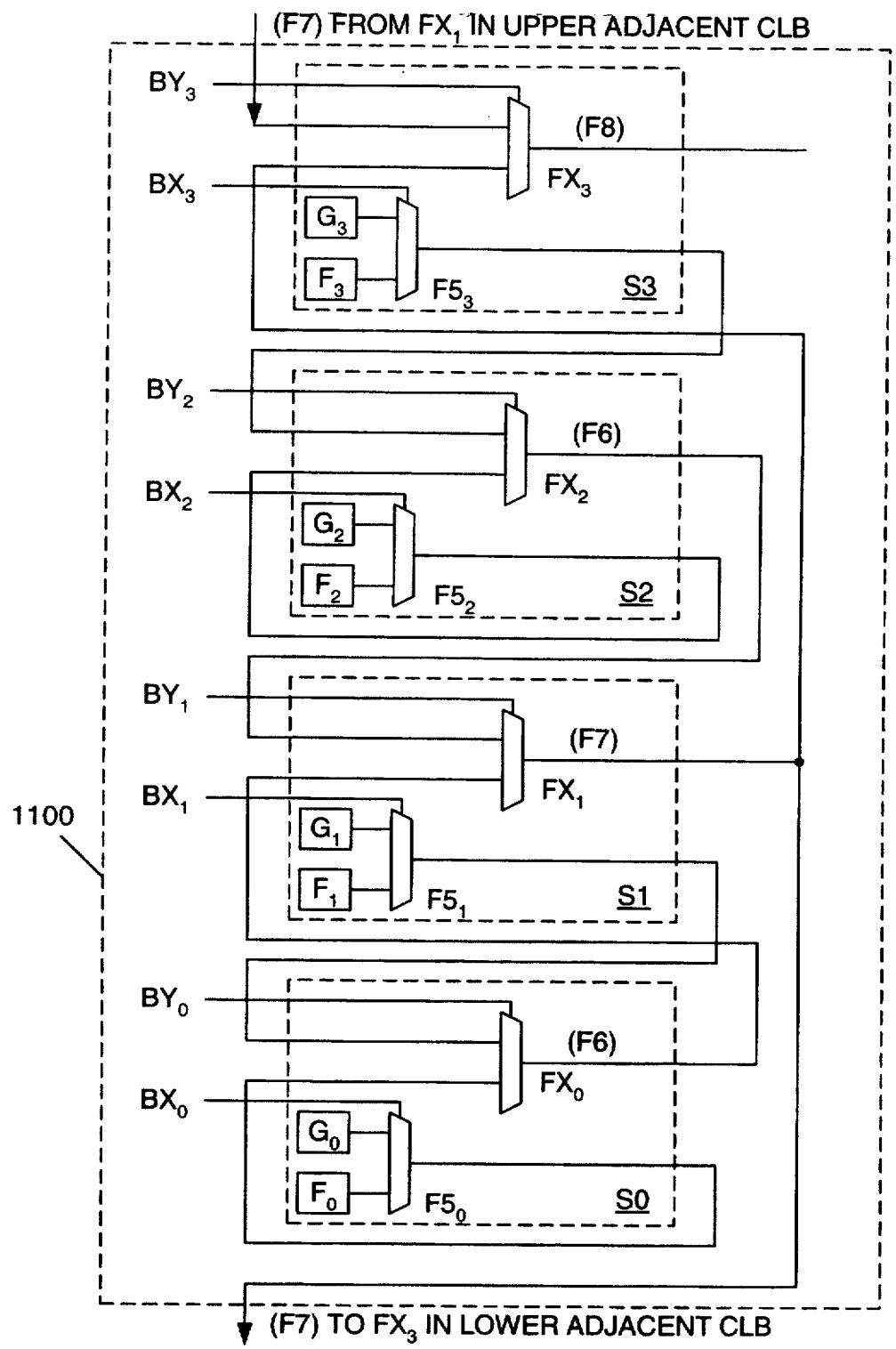
FIG. 22 is a block diagram illustrating a CLB that includes four CLE slices S0–S3, each of which is identical to the CLE slice S0 of FIG. 21.

FIG. 22 is a block diagram illustrating a CLB 1100 that includes four CLE slices S0–S3, each of which is identical to the CLE slice S0 of FIG. 21. FIG. 22 only illustrates G and F function generators and multiplexers F5 and FX in each of CLE slices S0–S3. Multiplexers F5 and FX are labeled as multiplexers $F5_N$ and $FX_N$ in CLE slice SN. For example, within CLE slice S2, multiplexers F5 and FX are labeled as multiplexers $F5_2$ and $FX_2$. Similarly, the control signals BX and BY are labeled as control signals $BX_N$ and $BY_N$ in CLE slice SN.

The output terminals of multiplexers $F5_0$ and $F5_1$ are connected to the input terminals of multiplexer $FX_0$ in CLE slice S0. As a result, multiplexer $FX_0$ is configured as an F6 multiplexer (i.e., a multiplexer capable of providing an output signal that is any function of six input signals). This F6 multiplexer is capable of providing an output signal that is any function of the four F/G input signals to CLE slices S0–S1 (note that the same four input signals are provided to each F and G function generator in CLE slices S0 and S1), the $BX_0/BX_1$ input signal (note that the same input signal is provided to control the $F5_0$ and $F5_1$ multiplexers), and the $BY_0$ input signal.

The output terminals of multiplexers $F5_2$ and $F5_3$ are connected to he input terminals of multiplexer $FX_2$ in CLE slice S2. As a result, multiplexer $FX_2$ is also configured as an F6 multiplexer. This F6 multiplexer is capable of providing an output signal that is any function of the four F/G input signals to CLE slices S2–S3 (note that the same four input signals are provided to each F and G function generator in CLE slices S2 and S3 ), the $BX_2/BX_3$ input signal (note that the same input signal is provided to control the $F5_2$ and $F5_3$ multiplexers), and the $BY_2$ input signal.

Because the F6 multiplexer has a total of 19 inputs, an F6 multiplexer can also be configured to provide some (but not all) functions of up to 19 input signals. For example, the F6 multiplexer can be used to implement an 8-to-1 multiplexer, which is a function of 11 input signals (i.e., 8 input signals+3 control signals).

The output terminals of F6 multiplexers $FX_0$ and $FX_2$ are connected to the input terminals of multiplexer $FX_1$ in CLE slice S1. As a result, multiplexer $FX_1$ is configured as an F7 multiplexer (i.e., a multiplexer capable of providing an output signal that is any function of seven input signals). This F7 multiplexer is capable of providing an output signal that is any function of the four F/G input signals to CLE slices S0–S3 (note that the same four input signals are provided to each F and G function generator in CLE slices S0–S3), the $BX_0/BX_1/BX_2/BX_3$ input signal (note that the same input signal is provided to control the $F5_0$, $F5_1$, $F5_2$, and $F5_3$ multiplexers), the $BY_0/BY_2$ input signal (note that the same input signal is provided to control the $FX_0$ and $FX_2$ multiplexers), and the $BY_1$ input signal, which is provided to control the $FX_1$ multiplexer.

Because the F7 multiplexer has a total of 39 inputs, an F7 multiplexer can also be configured to provide some (but not all) functions of up to 39 input signals. For example, the F7 multiplexer can be used to implement an 16-to-1 multiplexer, which is a function of 20 input signals (i.e., 16 input signals+4 control signals).

The output terminal of F7 multiplexer $FX_1$ is connected to an input terminal of multiplexer $FX_3$ in CLE slice S3. The other input terminal of multiplexer $FX_3$ is connected to an output terminal of an F7 multiplexer in an upper adjacent CLB (not shown). The F7 multiplexer in the upper adjacent CLB is configured in the same manner as multiplexer $FX_1$ in CLB 1100. Because multiplexer $FX_3$ is configured to receive input signals from two F7 multiplexers, multiplexer $FX_3$ functions as an F8 multiplexer (i.e., a multiplexer capable of providing an output signal that is any function of eight input signals).

Because the F8 multiplexer has a total of 79 inputs, an F8 multiplexer can also be configured to provide some (but not all) functions of up to 79 input signals. For example, the F8 multiplexer can be used to form a 32-to-1 multiplexer, which is a function of 37 input signals (i.e., 32 input signals+5 control signals). In addition, the F8 multiplexer can be used to form a 256-bit variable tap shift register. Note that the F8 multiplexer requires the use of 2 CLBs.

The output terminal of F7 multiplexer $FX_1$ is also connected to a lower adjacent CLB. More specifically, the output terminal of multiplexer $FX_1$ is connected to an input terminal corresponding to the upper input terminal of multiplexer $FX_3$.

CLB 1100 is connected to a plurality of identical CLBs 1100, thereby providing an array of CLBs that are capable of providing F5, F6, F7 and F8 functions. The structure of the F8 multiplexer extends across CLB boundaries in a regular manner. As a result, CLB 1100 can be connected to either the upper adjacent CLB or the lower adjacent CLB to implement an F8 multiplexer. This advantageously provides flexibility in the configuration of the resulting FPGA.

In addition, each of the CLE slices in the various CLBs has an identical logic (transistor) layout. This advantageously simplifies the configuration software of the resulting FPGA, as well as the physical layout of the CLB array on a silicon substrate.

The above-described CLB structure can be easily expanded to provide for arbitrarily large functions. As described above in connection with FIG. 22, an F8 multiplexer structure can be created with four CLE slices. By doubling the number of CLE slices per CLB, a multiplexer structure having an additional input can be implemented. Thus, an F9 multiplexer can be created with eight CLE slices per CLB, and an F10 multiplexer can be created with sixteen CLE slices per CLB.

Figure 23:
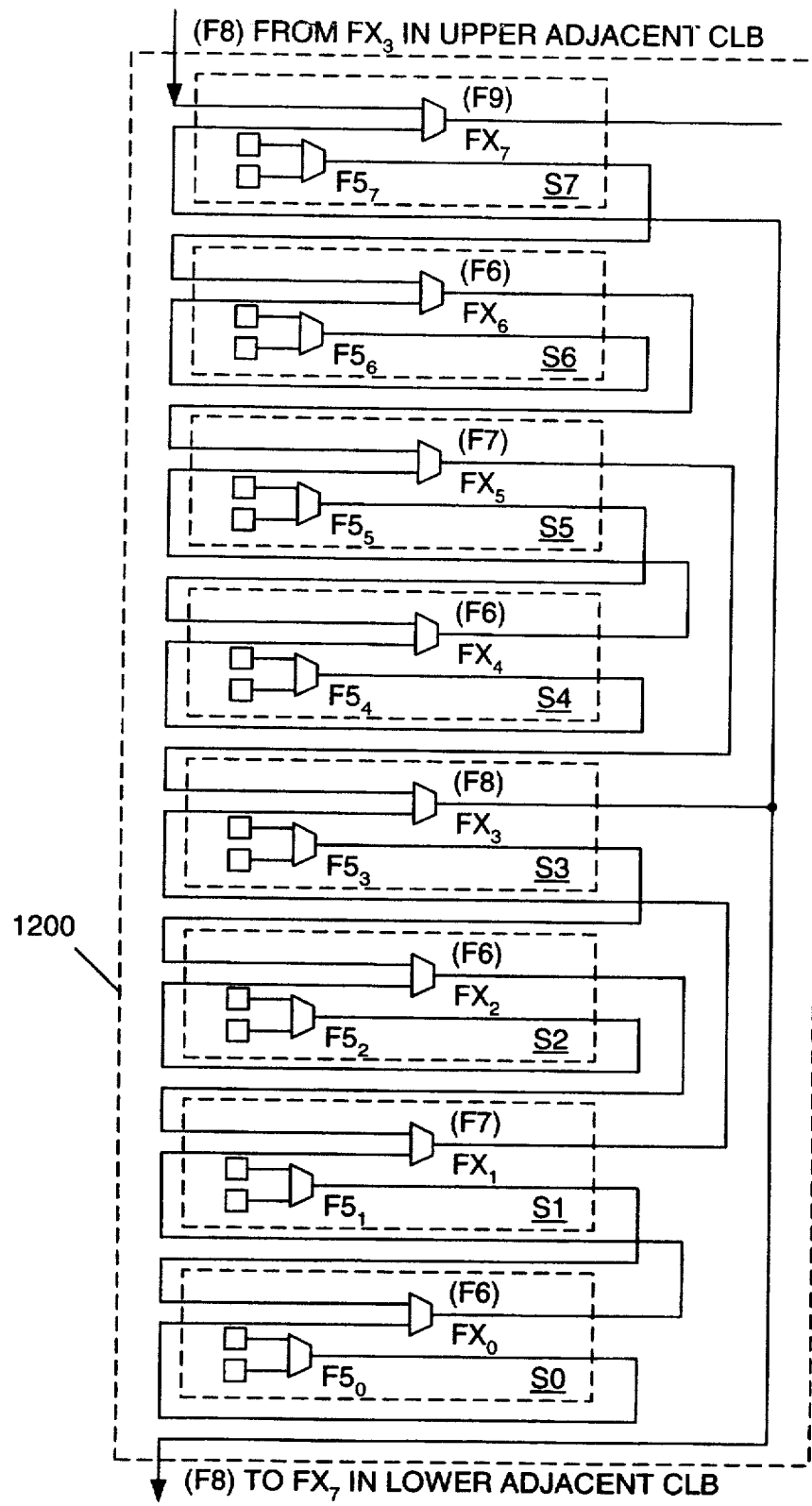
FIG. 23 is a block diagram of a CLB in accordance with another embodiment of the present invention.

FIG. 23 is a block diagram of a CLB 1200 in accordance with another embodiment of the present invention. CLB 1200 includes eight CLE slices identical to CLE slice S0. These slices S0–S7 are configured to provide a CLB array that is capable of providing an F9 multiplexer that can provide any function of up to nine input signals. CLE slices S0–S7 of FIG. 23 are Illustrated in the same manner as CLE slices S0–S3 in FIG. 22.

In CLB 1200, multiplexers $FX_0$, $FX_2$, $FX_4$ and $FX_6$ are all configured as F6 multiplexers. More specifically, the input terminals of multiplexer $FX_0$ are connected to the output terminals of multiplexers $F5_0$ and $F5_1$. The input terminals of multiplexer $FX_2$ are connected to the output terminals of multiplexers $F5_2$ and $F5_3$. The input terminals of multiplexer $FX_4$ are connected to the output terminals of multiplexers $F5_4$ and $F5_5$. The input terminals of multiplexer $FX_6$ are connected to the output terminals of multiplexers $F5_6$ and $F5_7$.

Multiplexers $FX_1$ and $FX_5$ are configured as F7 multiplexers. More specifically, the input terminals of multiplexer FX1 are connected to the output terminals of F6 multiplexers $FX_0$ and $FX_2$. The input terminals of multiplexer $FX_5$ are connected to the output terminals of F6 multiplexers $FX_4$ and $FX_6$.

Multiplexer $FX_3$ is configured as an F8 multiplexer. More specifically the input terminals of multiplexer $FX_3$ are connected to the output terminals of F7 multiplexers $FX_1$ and $FX_5$.

Finally multiplexer $FX_7$ is configured as an F9 multiplexer. More specifically, one input terminal of multiplexer $FX_7$ is connected to the output terminal of F8 multiplexer $FX_3$. The other input terminal of multiplexer $FX_7$ is connected to the output terminal of an F8 multiplexer in an upper adjacent CLB (not shown). This F8 multiplexer is located in a CLE slice identical to CLE slice S3 of CLB 1200. Note that the output terminal of F8 multiplexer $FX_3$ in CLE 1200 is also routed to a lower adjacent CLB (not shown). More specifically, the output terminal of multiplexer $FX_3$ is connected to the input terminal of the F9 multiplexer in the lower adjacent CLB.

The structure of the F9 multiplexer extends across CLB boundaries. However, each of the CLE slices and each of the CLBs are identical. This advantageously simplifies the configuration software of the resulting FPGA, as well as the layout of the FPGA on silicon.

Figure 24:
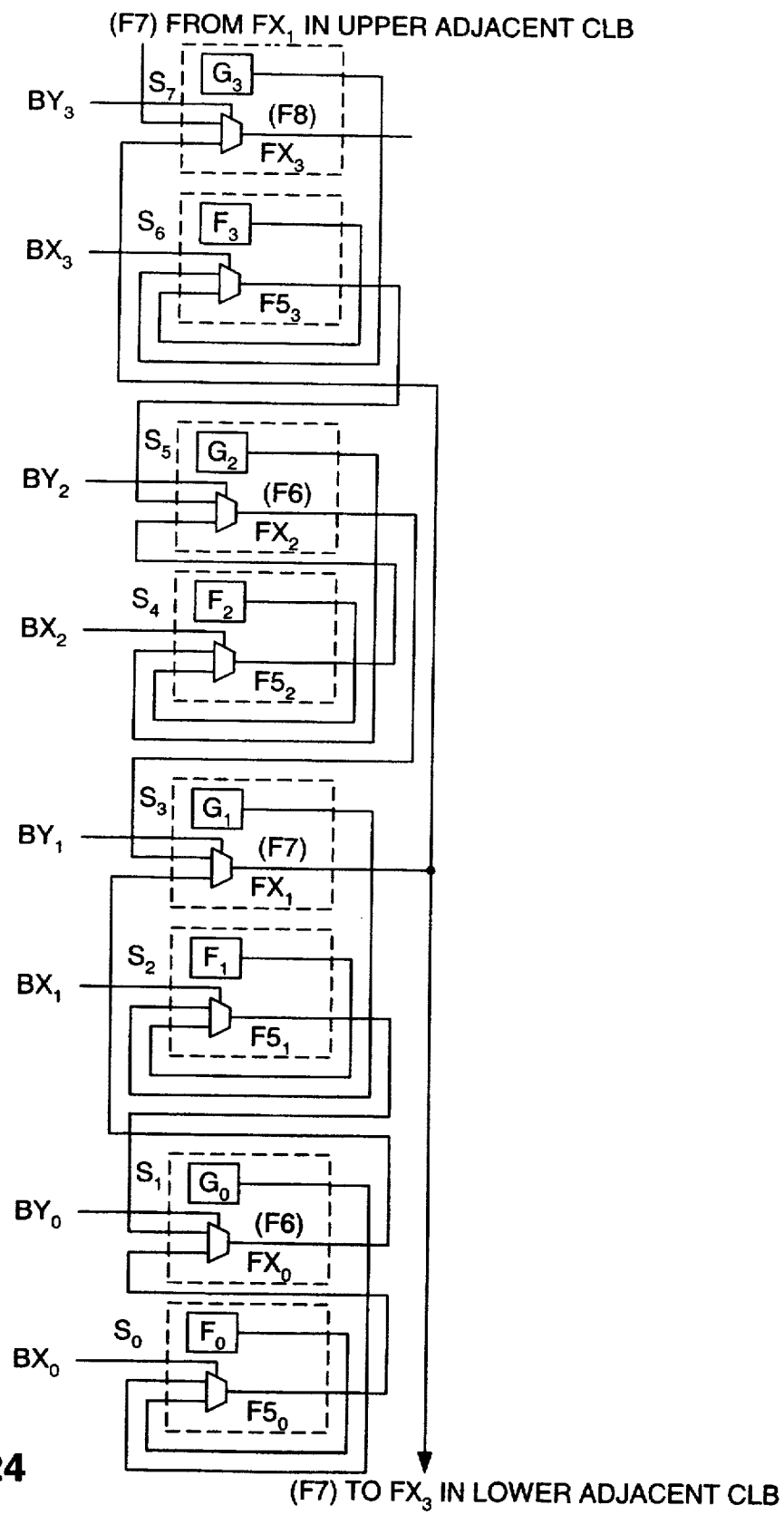
FIG. 24 is a block diagram of a CLB in accordance with yet another embodiment of the present invention.

In FIG. 21, CLE slice 1100 is defined to include a pair of function generators 1001–1002 and a pair of multiplexers F5 and FX. However, this is not necessary. In another embodiment, each CLE slice includes a single function generator and a single multiplexer that corresponds with either multiplexer F5 or multiplexer FX. FIG. 24 is a block diagram of a CLB 1200 in accordance with such an embodiment. CLB 1200 includes eight CLE slices $S_0$–$S_7$, wherein each of the CLE slices $S_0$–$S_7$ is defined to include one function generator and a corresponding multiplexer. (The other elements of CLE slices $S_0$–$S_7$ are not shown for purposes of clarity.) Similar elements in FIGS. 22 and 24 are labeled with similar reference numbers. The CLB structures illustrated by FIGS. 22 and 24 are similar. However, in FIG. 24, each of the F5 and FX multiplexers receives input signals from the general interconnect structure, and does not receive input signals from within the CLE slice. Thus, each of CLE slices $S_0$–$S_7$ includes a multiplexer that receives a user-defined control signal (i.e., BX or BY) and input signals from outside the CLE slice. (Note that a user-defined signal, as used herein, is not a signal provided by a configuration memory cell, but rather from a signal routed by the user on the general interconnect structure.) These identical CLE slices $S_0$–$S_7$ can be cascaded as illustrated to form wide function multiplexers (e.g., F5, F6, F7, and F8 multiplexers).

Returning to CLB 1100 of FIG. 22, in accordance with another embodiment of the present invention, CLE slices S0–S3 are connected in a manner that enables the function generators $F_0$–$F_3$ and $G_0$–$G_3$ in these CLE slices to be selectively connected to form random access memories (RAMs) of various sizes. As described above, each of the CLE slices S0–S3 has an identical transistor layout, thereby simplifying the design and configuration software of the resulting FPGA. In the described embodiment, CLB 1100 includes four CLE slices S0–S3 that can be configured to form RAMs having dimensions of 128×1, 64×2, 64×1, 32×4, 32×2, 32×1, 16×8, 16×4, 16×2 and 16×1. In other embodiments, this CLB structure can be expanded to include other numbers of CLE slices. In these embodiments, RAMs having other dimensions can be implemented. The manner of expanding the described CLB structure to include other numbers of CLE slices will be apparent to one of ordinary skill in the art in view of the following disclosure.

As described above, each 4-input F and G function generator includes sixteen memory cells that can be accessed in response to four address signals. In the described example, each F function generator is addressed by four read address signals F1–F4 and four write address signals WF1–WF4. The read address signals F1–F4 are separate from the write address signals WF1–WF4 to enable dual port access to the F function generator. Each G function generator is similarly configured to be accessed in response to read address signals G1–G4 and write address signals WG1–WG4.

Read Operations

To read one of the sixteen data values stored in an F or G function generator, a read address F1–F4 or G1–G4 is applied to the function generator. In response, the F or G function generator provides a data value corresponding to the read address as an output signal F' or G'.

In the described embodiment, multiplexers $FX_0$–$FX_3$ and $F5_0$–$F5_3$ of CLE slices S0–S3 are connected as described above in connection with FIG. 22. As described in more detail below, these multiplexers are used to route read data values from function generators $F_0$–$F_4$ and $G_0$–$G_4$ to an appropriate output terminal.

128×1

More specifically, to operate CLB 1100 as a 128×1 RAM, the 128 memory cells in the $F_0$–$F_4$ and $G_0$–$G_4$ function generators of CLE slices S0–S3 are used to store 128 data values. The $F_0$–$F_4$ and $G_0$–$G_4$ function generators are addressed by the same four read address signals (i.e., F1/G1, F2/G2, F3/G3, F4/G4) during a read operation. These four read address signals are hereinafter referred to as address signals $A_1$–$A_4$. A single bypass signal (i.e., $BX_0/BX_1/BX_2/BX_3$) is used to control multiplexers $F5_0$, $F5_1$, $F5_2$, and $F5_3$, thereby selecting either the output signals of the $F_0$–$F_3$ function generators or the output signals of the $G_0$–$G_3$ function generators. The bypass signal $BX_0/BX_1/BX_2/BX_3$ is thereby used as a fifth address signal $A_5$. In the described embodiment, if the fifth address signal $A_5$ has a logic "1" value, then multiplexers $F5_0$, $F5_1$, $F5_2$, and $F5_3$ route the output signals of the $F_0$–$F_3$ function generators. Conversely, if the fifth address signal $A_5$ has a logic "0" value, then multiplexers $F5_0$, $F5_1$, $F5_2$, and $F5_3$ route the output signals of the $G_0$–$G_3$ function generators.

Another bypass signal (i.e., $BY_0/BY_2$) is used to control F6 multiplexers $FX_0$ and $FX_2$, thereby selecting either the output signals of the $F5_0$ and $F5_2$ multiplexers or the output signals of the $F5_1$ and $F5_3$ multiplexers. The bypass signal $BY_0/BY_2$ is thereby used as a sixth address signal $A_6$. In the described embodiment, if the sixth address signal $A_6$ has a logic "1" value, then multiplexers $FX_0$ and $FX_2$ route the output signals of the $F5_0$ and $F5_2$ multiplexers, respectively. Conversely, if the sixth address signal $A_6$ has a logic "0" value, then multiplexers $FX_0$ and $FX_2$ route the output signals of the $F5_1$ and $F5_3$ multiplexers, respectively.

Another bypass signal (i.e., $BY_1$) is used to control F7 multiplexer $FX_1$, thereby selecting either the output signal of F6 multiplexer $FX_0$ or the output signal of F6 multiplexer $FX_2$ as the read data output signal. The bypass signal $BY_1$ is thereby used as a seventh address signal $A_7$. In the described embodiment, if the seventh address signal $A_7$ has a logic "1" value, then multiplexer $FX_1$ routes the output signal of the $FX_0$ multiplexer as the read output data value. Conversely, if the seventh address signal $A_7$ has a logic "0" value, then multiplexer $FX_1$ routes the output signal of the $FX_2$ multiplexer as the read output data value.

As described in more detail below, the address signals $A_5$–$A_7$ are also, used to address the 128×1 RAM during write operations. As also described in more detail below, the unused bypass signal $BY_3$ is used to provide a write data value to the 128×1 RAM during write operations.

64×2, 64×1

To operate CLB 1100 as a 64×2 RAM, the 64 memory cells in the $F_0$, $G_0$, $F_1$ and $G_1$ function generators of CLE slices S0 and S1 are used to store a first set of 64 data values, and the 64 memory cells in the $F_2$, $G_2$, $F_3$ and $G_3$ function generators of CLE slices S2 and S3 are used to store a second set of 64 data values. In general, one of the 64 data values in function generators $F_0$, $G_0$, $F_1$ and $G_1$ is read out through multiplexers $F5_0$, $F5_1$ and $FX_0$ as a first bit of the two bit output signal. Similarly, a corresponding one of the 64 data values in function generators $F_2$, $G_2$, $F_3$ and $G_3$ is read out through multiplexers $F5_2$, $F5_3$ and $FX_2$ as a second bit of the two bit output signal.

More specifically, the $F_0$–$F_3$ and $G_0$–$G_3$ function generators are addressed by the same four read address signals $A_1$–$A_4$ during a read operation. Multiplexers $F5_0$–$F5_3$ are controlled by the fifth address signal $A_5$ (i.e., $BX_0/BX_1/BX_2/BX_3$), such that these multiplexers select either the output signals of the $F_0$–$F_3$ function generators or the output signals of the $G_0$–$G_3$ function generators. F6 multiplexers $FX_0$ and $FX_2$ are controlled by the sixth address signal $A_6$ (i.e., $BY_0/BY_2$), such that these multiplexers select either the output signals of multiplexers $F5_0$ and $F5_2$ or the output signals of multiplexers F5 and $F5_3$. In this manner, F6 multiplexer $FX_0$ provides one bit of the read output signal, and F6 multiplexer $FX_2$ provides the other bit of the read output signal in the 64×2 RAM.

As described in more detail below, the address signals $A_5$–$A_6$ are also used to address the 64×2 RAM during write operations. As also described in more detail below, the unused bypass signals $BY_1$ and $BY_3$ are used to provide write data values to the 64×2 RAM.

A 64×1 RAM, which uses only CLE slices S0 and S1, is a subset of the 64×2 RAM, which uses CLE slices S0, S1, S2, and S3. The 64×1 RAM is accessed in the same manner as the 64×2 RAM. An independent 64×1 RAM can not be implemented in S2 and S3 because the write addresses of S2 and S3 are tied to S0 and S1.

32×4, 32×2, 32×1

To operate CLB 1100 as a 32×4 RAM, the 32 memory cells in the $F_0$ and $G_0$ function generators of CLE slice S0 are used to store a first set of 32 data values, the 32 memory cells in the $F_1$ and $G_1$ function generators of CLE slice S1 are used to store a second set of 32 data values, the 32 memory cells in the $F_2$ and $G_2$ function generators of CLE slice S2 are used to store a third set of 32 data values, and the 32 memory cells in the $F_3$ and $G_3$ function generators of CLE slice S3 are used to store a fourth set of 32 data values.

In general, one of the 32 data values in function generators $F_0$ and $G_0$ is read out through multiplexer $F5_0$ as a first bit of the four bit output signal. Similarly, a corresponding one of the 32 data values in function generators $F_1$ and $G_1$ is read out through multiplexer $F5_1$ as a second bit of the four bit output signal. A corresponding one of the 32 data values in function generators $F_2$ and $G_2$ is read out through multiplexer $F5_2$ as a third bit of the four bit output signal. Finally, a corresponding one of the 32 data values in function generators $F_3$ and $G_3$ is read out through multiplexer $F5_3$ as a fourth bit of the four bit output signal.

More specifically, the $F_0$–$F_3$ and $G_0$–$G_3$ function generators are addressed by the same four read address signals $A_1$–$A_4$ during a react operation. Multiplexers $F5_0$–$F5_3$ are controlled by the fifth address signal $A_5$ (i.e., $BX_0/BX_1/BX_2/BX_3$), such that these multiplexers select either the output signals of the $F_0$–$F_3$ function generators or the output signals of the $G_0$–$G_3$ function generators. In this manner, multiplexers $F5_0$–$F5_3$ provide the four bits of the read output signal in the 32×4 RAM.

As described in more detail below, the address signal $A_5$ is also used to address the 32×4 RAM during write operations. As also described in more detail below, the unused bypass signals $BY_0$–$BY_3$ are used to provide write data values to the 32×4 RAM.

A 32×2 RAM is a subset of the 32×4 RAM, which uses only CLE slices S0 and S1. Similarly, a 32×1 RAM is a subset of the 32×4 RAM, which uses only CLE slice S0. The 32×2 and 32×1 RAMs are accessed in the same manner as the 32×4 RAM.

16×8, 16×4, 16×2, 16×1

It is noted that CLB 1100 can be operated as a 16×8, 16×4, 16×2 or 16×1 RAM by using the data values read directly out of the lookup tables F0–F3 and G0–G3. In these RAMs, it is not necessary to use multiplexers $F5_0$–$F5_3$ and $FX_0$–$FX_3$ to select the read data values. As described in more detail below, in the 16×8, 16×4, 16×2 or 16×1 RAMs, the unused bypass signals $BX_0$–$BX_3$ and $BY_0$–$BY_3$ are used to provide up to eight write data values to the 16×8 RAM.

In the foregoing manner, read data values for 128×1, 64×2, 64×1, 32×4, 32×2, 32×1, 16×8, 16×4, 16×2 and 16×1 RAMs can be routed out of CLB 1100 through multiplexers $F5_0$–$F5_3$ and $FX_0$–$FX_3$.

Write Operations

In order to operate CLE 1100 as a 128×1, 64×2, 64×1, 32×4, 32×2, 32×1, 16×8, 16×4, 16×2 and 16×1 RAM, it is necessary to provide a mechanism for routing input data values to the function generators $F_0$–$F_3$ and $G_0$–$G_3$ in a manner consistent with the various RAM configurations. As described in more detail below, this mechanism is largely provided by multiplexers 1010 and 1016 of CLE slice S0 (FIG. 21).

In addition, it is necessary to provide a mechanism for providing write enable signals to the various function generators $F_0$–$F_3$ and $G_0$–$G_3$ in a manner consistent with the various RAM configurations. As described in more detail below, this mechanism is largely provided by write control logic 1009, along with multiplexers 1030–1031 and inverter 1040 (FIG. 21).

Write Data Routing

Figure 25:
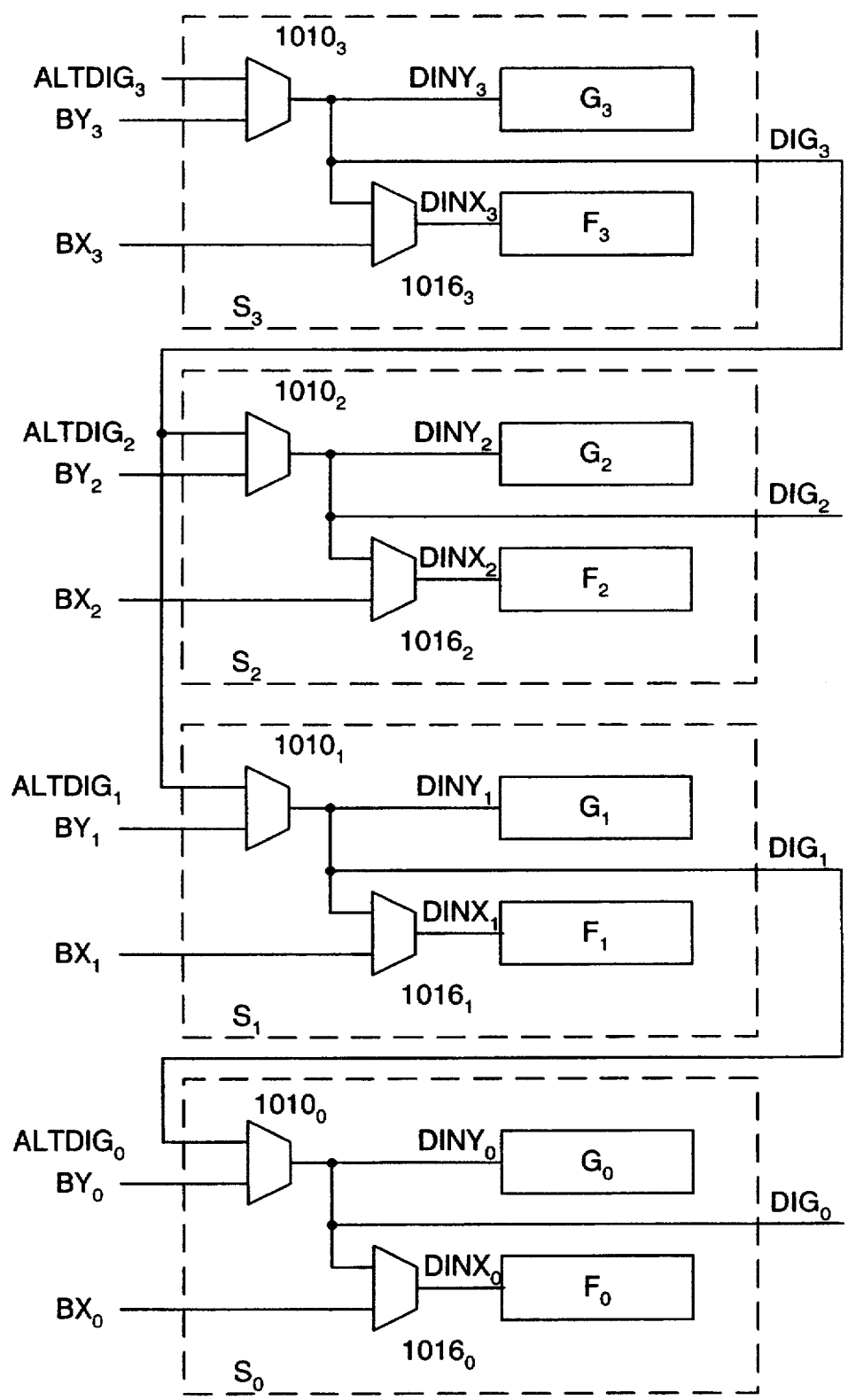
FIG. 25 is a block diagram illustrating selected multiplexers in the CLE slice of FIG. 21, as well as the associated function generators.

FIG. 25 is a block diagram illustrating the multiplexers corresponding with multiplexers 1010 and 1016 in CLE slices S0–S3, as well as function generators $F_0$–$F_3$ and $G_0$–$G_3$. These multiplexers are labeled with the reference numbers $1010_N$ and $1016_N$, where N is the number slice in which the multiplexers are located. For example, multiplexers 1010 and 1016 in CLE slice S2 are labeled with the reference numbers $1010_2$ and $1016_2$, respectively. Many elements of CLE slices S0–S3 are not shown for purposes of clarity. In addition, the SHIFTIN input signals to multiplexers $1010_0$–$1010_3$ and the input signals from the $G_0$–$G_3$ function generators to multiplexers $1016_0$–$1016_3$ are not shown in FIG. 25, as these signals are not material to the present embodiment.

Each of multiplexers $1010_0$–$1010_3$ is coupled to receive a corresponding one of alternate data input signals $ALTDIG_0$–$ALTDIG_3$ and a corresponding one of bypass signals $BY_0$–$BY_3$. Each of multiplexers $1016_0$–$1016_3$ is coupled to receive an output signal from a corresponding one of multiplexers $1010_0$–$1010_3$ and a corresponding one of bypass signals $BX_0$–$BX_3$. The output signals provided by multiplexers $1010_0$–$1010_3$ are routed from CLE slices S0–S3 as data signals $DIG_0$–$DIG_3$, respectively. Data signal $DIG_3$ is routed to provide input data signals $ALTDIG_2$ and $ALTDIG_1$ in CLE slices S2 and S1. Data signal $DIG_1$ is routed to provide input data signal $ALTDIG_0$ in CLE slice S0.

The output signals of multiplexers $1010_0$–$1010_3$ are also provided to G function generators $G_0$–$G_3$ as write data input signals $DINY_0$–$DINY_3$, respectively. The output signals of multiplexers $1016_0$–$1016_3$ are provided to F function generators $F_0$–$F_3$ as write data input signals $DINX_0$–$DINX_3$, respectively.

Multiplexers $1010_0$–$1010_3$ and $1016_0$–$1016_3$ are controlled as follows to route write data values to function generators $F_0$–$F_3$ and $G_0$–$G_3$.

128×1

When CLB 1100 is to operate as a 128×1 RAM, multiplexers $1010_0$–$1010_3$ and $1016_0$–$1016_3$ are configured to route the bypass signal $BY_3$ to the data input terminals of function generators $F_0$–$F_3$ and $G_0$–$G_3$. As a result, $DINY_3 = DINX_3 = DINY_2 = DINX_2 = DINY_1 = DINX_1 = DINY_0 = DINX_0 = BY_3$. Note that the bypass signal $BY_3$ is routed from CLE slice S3 to CLE slices S2 and S1 as the data signal $DIG_3$. Similarly, the bypass signal $BY_3$ is routed from CLE slice S1 to CLE slice S0 as the data signal $DIG_1$. As described in more detail below, a write enable control signal will be applied to one of function generators $F_0$–$F_3$ and $G_0$–$G_3$, thereby enabling the write data input signal ($BY_3$) to be written to this write-enabled function generator. The generation of this write enable control signal is controlled by the bypass signals $BX_0$–$BX_3$ and $BY_0$–$BY_2$ (i.e., the bypass signals other than $BY_3$).

64×2, 64×1

When CLB 1100 is to operate as a 64×2 RAM, the bypass signal $BY_1$ operates as a first write data input signal, and the bypass signal $BY_3$ operates as a second write data input signal. More specifically, multiplexers $1010_0$–$1010_1$ and $1060_0$–$1016_1$ are configured to route the bypass signal $BY_1$ to the write data input terminals of function generators $F_0$–$F_1$ and $G_0$–$G_1$. As a result, $DINY_1 = DINX_1 = DINY_0 = DINX_0 = BY_1$. Similarly, multiplexers $1010_2$–$1010_3$ and $1016_2$–$1016_3$ are configured to route the bypass signal $BY_3$ to the write data input terminals of function generators $F_2$–$F_3$ and $G_2$–$G_3$. As a result, $DINY_3 = DINX_3 = DINY_2 = DINX_2 = BY_3$.

As described in more detail below, during a write operation, a first write enable control signal is applied to one of function generators $F_0$, $F_1$, $G_0$ and $G_1$, and a second write enable control signal is applied to a corresponding one of function generators $F_2$, $F_3$, $G_2$, and $G_3$. In response, the write input data signals ($BY_1$ and $BY_3$) are written to the two function generators receiving the first and second write enable control signals. As described in more detail below, these first and second write enable control signals are generated in response to the bypass signals $BX_0$–$BX_3$, $BY_0$ and $BY_2$ (i.e., tie bypass signals not used as write data input signals).

When CLB 1100 is to operate as a 64×1 RAM, CLE slices S0 and S1 are configured in the same manner described above for the 64×2 RAM. Thus, bypass signal $BY_1$ is used as the write input data signal and the bypass signals $BX_0$–$BX_1$ and $BY_0$ are used to generate the required write enable signal. In the 64×1 RAM configuration, function generators $F_2$–$F_3$ and $G_2$–$G_3$ are free to perform other functions.

32×4, 32×2, 32×1

When CLB 1100 is to operate as a 32×4 RAM, the bypass signals $BY_0$–$BY_3$ operate as four write data input signals.

Thus, multiplexers $1010_0$–$1010_3$ are configured to route the bypass signals $BY_0$–$BY_3$ to function generators $G_0$–$G_3$, respectively. Similarly, multiplexers $1016_0$–$1016_3$ are configured to route the bypass signals $BY_0$–$BY_3$ to function generators $F_0$–$F_3$, respectively. Thus, $DINY_3 = DINX_3 = BY_3$, $DINY_2 = DINX_2 = BY_2$, $DINY_1 = DINX_1 = BY_1$, and $DINY_0 = DINX_0 = BY_0$.

As described in more detail below, during a write operation, a set of four write enable control signals is applied to either function generators $F_0$–$F_3$ or to function generators $G_0$–$G_3$. In response, the write input data signals ($BY_0$–$BY_3$) are written to the four function generators receiving the write enable control signals. As described in more detail below, the set of four write enable control signals are generated in response to the bypass signals $BX_0$–$BX_3$ (i.e., the bypass signals not used as write data input signals).

When CLB 1100 is to operate as a 32×2 RAM, CLE slices S0 and S1 are configured in the same manner described above for the 32×4 RAM. Thus, bypass signals $BY_0$ and $BY_1$ are used as the write input data signal and the bypass signals $BX_0$–$BX_1$ are used to generate the required write enable signals. In the 32×2 RAM configuration, function generators $F_2$–$F_3$ and $G_2$–$G_3$ are free to perform other functions.

Similarly, when CLB 1100 is to operate as a 32×1 RAM, CLE slice S0 is configured in the same manner described above for the 32×4 RAM. Thus, bypass signal $BY_0$ is used as the write input data signal and the bypass signal $BX_0$ is used to generate the required write enable signals. In the 32×1 RAM configuration, function generators $F_1$–$F_3$ and $G_1$–$G_3$ are free to perform other functions.

In the foregoing manner, multiplexers $1010_0$–$1010_3$ and $1016_0$–$1016_3$ provide a structure that enables the flexible application of write data values to function generators $F_0$–$F_3$ and $G_0$–$G_3$. Advantageously, many variations are possible, even though each of the CLE slices S0–S3 has an identical transistor layout.

In the 128×1, 64×2, 32×4, and 16×8 RAMS, the write address terminals WF0–WF3 and WG0–WG3 of each of the function generators F0–F3 and G0–G3 are coupled to receive the $A_1$–$A_4$ address signals. This is because these configurations all have shared read and write addresses. However, these write address signals are only effective within the associated function generator if the write enable signal corresponding to the function generator is asserted low.

Write Enable Control Signals

The mechanism for generating the write enable control signals for the various RAMs will now be described. Within each CLE slice, a pair of write enable control signals are generated by write control circuit 1009 (FIG. 22). In the present description, the write control circuits in CLE slices S0–S3 are labeled as write control circuits $1009_0$–$1009_3$, respectively.

Figure 26:
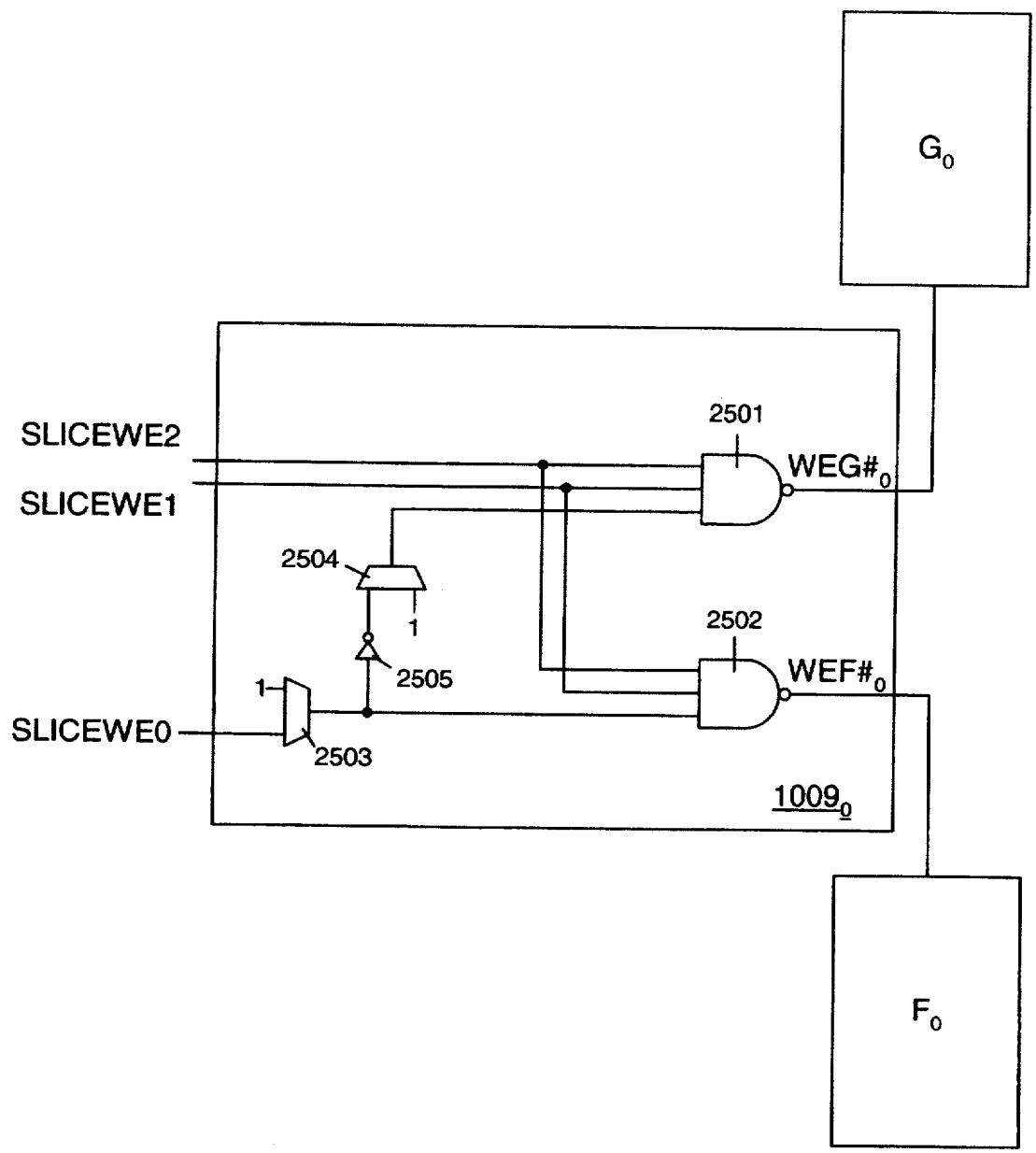
FIG. 26 is a circuit diagram of the write control circuit of the CLE slice of FIG. 21 in accordance with one embodiment of the present invention.

FIG. 26 is a circuit diagram of write control circuit $1009_0$ of CLE slice S0 in accordance with one embodiment of the present invention. Write control circuit $1009_0$ includes NAND gates 2501–2502, multiplexers 2503–2504 and inverter 2505. If multiplexer 2503 is configured to route the SLICEWE0 signal, then multiplexer 2503 provides the SLICEWE0 signal to NAND gate 2502. If multiplexer 2504 is configured to pass the output signal provided by inverter 2505, then multiplexer 2504 provides the inverse of the SLICEWE0 signal (SLICEWE0#) to NAND gate 2501. Under these conditions, the SLICEWE0 signal is said to be 'enabled' within write control circuit $1009_0$. (Note that if multiplexers 2503 and 2504 are configured to pass logic "1" values, then NAND gates 2501 and 2502 will receive these logic "1" values, thereby effectively disabling he SLICEWE0 signal).

Assuming chat the SLICEWE0 signal is enabled in write control circuit $1009_0$, NAND gate 2501 generates a write enable control signal WEG#$_0$ in response to the SLICEWE2 signal, the SLICEWE1 signal, and the SLICEWE0# signal. Similarly, NAND gate 2502 generates a write enable control signal WEF#$_0$ in response to the SLICEWE2 signal, the SLICEWE1 signal, and the SLICEWE0 signal. The WEG#$_0$ and WEF#$_0$ write control signals are provided to the write enable input terminals of function generators $G_0$ and $F_0$, respectively. When one of the WEG# and WEF#$_0$ write control signals is asserted LOW, a write operation is enabled in the corresponding function generator $G_0$ or $F_0$. As described in more detail below, bypass output signals BYOUT and inserted bypass output signals BYINVOUT are generally provided as the SLICEWE2 and SLICEWE1 signals. The bypass output signals BXOUT are generally provided as the SLICEWE0 signals.

Figure 27:
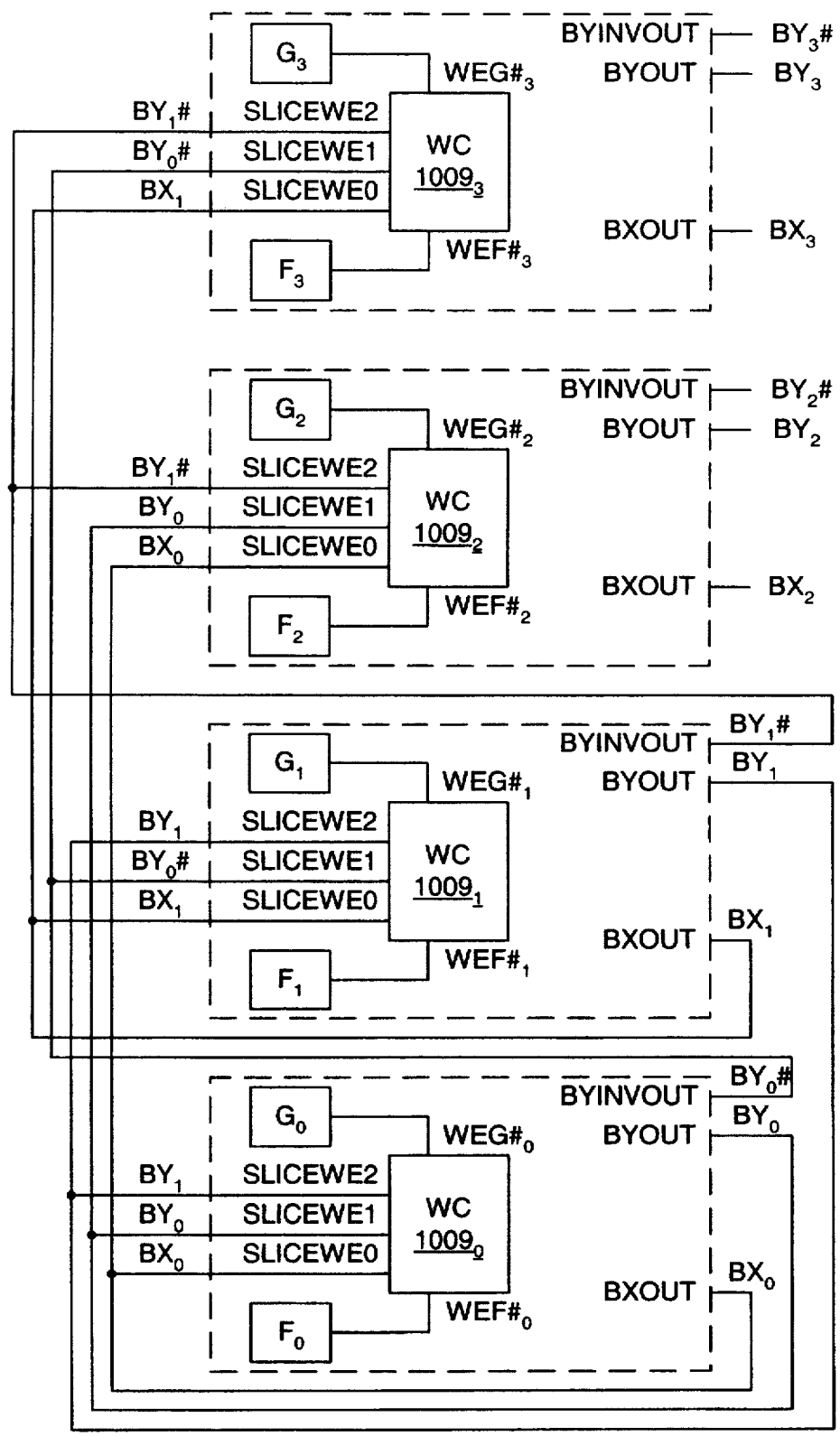
FIG. 27 is a block diagram illustrating the write control circuits in the CLE slices of FIG. 22 in accordance with one embodiment of the present invention.

FIG. 27 is a block diagram illustrating the write control circuits $1009_0$–$1009_3$ and function generators $F_0$–$F_3$, $G_0$–$G_3$ in CLE sluices S0–S3 of CLB 1100 in accordance with the described embodiment. The other elements of CLE slices S0–S3 are not shown in FIG. 27 for purposes of clarity. Write control circuit $1009_0$ is connected to receive bypass signals $BY_1$, $BY_0$, and $BX_0$. Write control circuit $1009_1$ is connected to receive bypass signals $BY_1$, $BY_0$#, and $BX_1$. Write control circuit $1009_2$ is connected to receive bypass signals $BY_1$#, $BY_0$, and $BX_0$. Write control circuit $1009_3$ is connected to receive bypass signals $BY_1$#, $BY_0$#, and $BX_1$.

Referring to FIG. 21, it is noted that the BY and BY# bypass signals, which are provided as output signals at the BYOUT and BYINVOUT terminals, can be disabled (i.e., set at logic "1" values) by configuring multiplexers 1030 and 1031 in the appropriate manner. Conversely, these multiplexers 1030 and 1031 can be configured to enable the BY and BY# signals at the BYOUT and BYINVOUT output terminals.

128×1

The writes control structure of CLB 1100 operates as follows. When CLB 1100 is to be operated as a 128×1 RAM, the bypass signals $BY_0$–$BY_1$, $BY_0$#–$BY_1$# and $BX_0$–$BX_1$ provided to write control circuits $1009_0$–$1009_3$ are all enabled. Bypass signals $BX_0$–$BX_1$ are identical, and correspond with the fifth address signal $A_5$. Bypass signal $BY_0$ corresponds with the sixth address signal $A_6$, and bypass signal $BY_1$ corresponds with the seventh address signal $A_7$. Table 1 below summarizes the manner in which write control circuits $1009_0$–$1009_3$ assert the write enable signals WEG#$_0$–WEG#$_3$ and WEF#$_0$–WEF#$_3$ in response to the address signals $A_7$–$A_5$.

TABLE 1

| $A_7$–$A_5$ | WEG#$_3$ | WEF#$_3$ | WEG#$_2$ | WEF#$_2$ | WEG#$_1$ | WEF#$_1$ | WEG#$_0$ | WEF#$_0$ |
|---|---|---|---|---|---|---|---|---|
| 000 | 0 | 1 | 1 | 1 | 1 | 1 | 1 | 1 |
| 001 | 1 | 0 | 1 | 1 | 1 | 1 | 1 | 1 |
| 010 | 1 | 1 | 0 | 1 | 1 | 1 | 1 | 1 |
| 011 | 1 | 1 | 1 | 0 | 1 | 1 | 1 | 1 |
| 100 | 1 | 1 | 1 | 1 | 0 | 1 | 1 | 1 |
| 101 | 1 | 1 | 1 | 1 | 1 | 0 | 1 | 1 |
| 110 | 1 | 1 | 1 | 1 | 1 | 1 | 0 | 1 |
| 111 | 1 | 1 | 1 | 1 | 1 | 1 | 1 | 0 |

As shown in Table 1, a different one of the function generators F0–F3, G0–G3 is write-enabled for each instance of the address signals $A_7$–$A_5$. Thus, the addressing scheme of the write control structure corresponds with the addressing scheme of the read control structure described above.

64×2 or 64×1

When CLB 1100 is to be operated as a 64×2 or 64×1 RAM, bypass signals $BY_0$, $BY_0$#, and $BX_0$–$BX_1$, provided to write control circuits $1009_0$–$1009_3$ are enabled. Bypass signals $BY_1$ $BY_1$# provided to write control circuits $1009_0$–$1009_3$ are disabled (i.e., set to logic "1" values) by appropriately configuring the multiplexers 1030–1031 in CLE slice S1. As described above, bypass signal $BY_1$ is used as a write data value in this configuration. Bypass signals $BX_0$–$BX_1$ are identical, and correspond with the fifth address signal $A_5$. Bypass signal $BY_0$ corresponds with the sixth address signal $A_6$. Table 2 below summarizes the manner in which write control circuits $1009_0$–$1009_3$ assert the write enable signals WEG#$_0$–WEG#$_3$ and WEF#$_0$–WEF#$_3$ in response to the address signals $A_6$–$A_5$.

TABLE 2

| $A_6$–$A_5$ | WEG#$_3$ | WEF#$_3$ | WEG#$_2$ | WEF#$_2$ | WEG#$_1$ | WEF#$_1$ | WEG#$_0$ | WEF#$_0$ |
|---|---|---|---|---|---|---|---|---|
| 00 | 0 | 1 | 1 | 1 | 0 | 1 | 1 | 1 |
| 01 | 1 | 0 | 1 | 1 | 1 | 0 | 1 | 1 |
| 10 | 1 | 1 | 0 | 1 | 1 | 1 | 0 | 1 |
| 11 | 1 | 1 | 1 | 0 | 1 | 1 | 1 | 0 |

As shown in Table 2, a different pair of the function generators F0–F3, G0–G3 is write-enabled for each instance of the address signals $A_6$–$A_5$. Thus, the addressing scheme of the write control structure corresponds with the addressing scheme of the read control structure described above.

32×4, 32×2 or 32×1

When CLB 1100 is to be operated as a 32×4, 32×2 or 32×1 RAM, the bypass signals $BX_0$–$BX_1$ provided to write control circuits $1009_0$–$1009_3$ are enabled. Bypass signals $BY_0$–$BY_1$ and $BY_0\#$–$BY_1\#$ provided to write control circuits $1009_0$–$1009_3$ are disabled (i.e., set to logic "1" values) by appropriately configuring the multiplexers 1030 and 1031 in CLE slices S0–S3. As described above, bypass signals $BY_1$ and $BY_0$ are used as write data values in this configuration. Bypass signals $BX_0$–$BX_1$ are identical, and correspond with the fifth address signal $A_5$. Table 3 below summarizes the manner in which write control circuits $1009_0$–$1009_3$ assert the write enable signals $WEG\#_0$–$WEG\#_3$ and $WEF\#_0$–$WEF\#_3$ in response to the address signal

TABLE 3

| $A_5$ | $WEG\#_3$ | $WEF\#_3$ | $WEG\#_2$ | $WEF\#_2$ | $WEG\#_1$ | $WEF\#_1$ | $WEG\#_0$ | $WEF\#_0$ |
|---|---|---|---|---|---|---|---|---|
| 0 | 0 | 1 | 0 | 1 | 0 | 1 | 0 | 1 |
| 1 | 1 | 0 | 1 | 0 | 1 | 0 | 1 | 0 |

As shown in Table 3, a different set of four function generators is write-enabled for each instance of the address signal $A_5$. Thus, the addressing scheme of the write control structure corresponds with the addressing scheme of the read control structure described above.

In the foregoing manner, the write enable signals are provided to function generators $F_0$–$F_3$ and $G_0$–$G_3$. Advantageously, a wide variety of write enable signal patterns can be provided to the function generators $F_0$–$F_3$ and $G_0$–$G_3$ in the CLB 1100, with relatively little overhead. In addition, because the transistor layout of each of the CLE slices is identical, the layout and software configuration of the resulting FPGA is simplified.

The functionality of the bypass signals $BX_0$–$BX_3$ and $BY_0$–$BY_3$ in the 128×1, 64×2, 32×4 and 16×8 RAM embodiments is summarized below in Table 4.

TABLE 4

| Signal | 128 × 1 | 64 × 2 | 32 × 4 | 16 × 1 |
|---|---|---|---|---|
| $BY_3$ | DATA | DATA | DATA | DATA |
| $BY_2$ | $A_6$ | $A_6$ | DATA | DATA |
| $BY_1$ | $A_7$ | DATA | DATA | DATA |
| $BY_0$ | $A_6$ | $A_6$ | DATA | DATA |
| $BX_3$ | $A_5$ | $A_5$ | $A_5$ | DATA |
| $BX_2$ | $A_5$ | $A_5$ | $A_5$ | DATA |
| $BX_1$ | $A_5$ | $A_5$ | $A_5$ | DATA |
| $BX_0$ | $A_5$ | $A_5$ | $A_5$ | DATA |

In accordance with yet another embodiment of the present invention, CLB 1100 can be operated as a dual-port RAM of various sizes. In the above-described single-port RAM embodiments, the address signals $A_1$–$A_4$ are provided to each of the function generators $F_0$–$F_3$ and $G_0$–$G_3$ used to implement the single-port RAM. The routing of address signals $A_1$–$A_4$ in the single-port embodiments is therefore straightforward. However, in the case of a dual-port implementation, the routing of the address signals A1–A4 becomes more complex.

Figure 28:
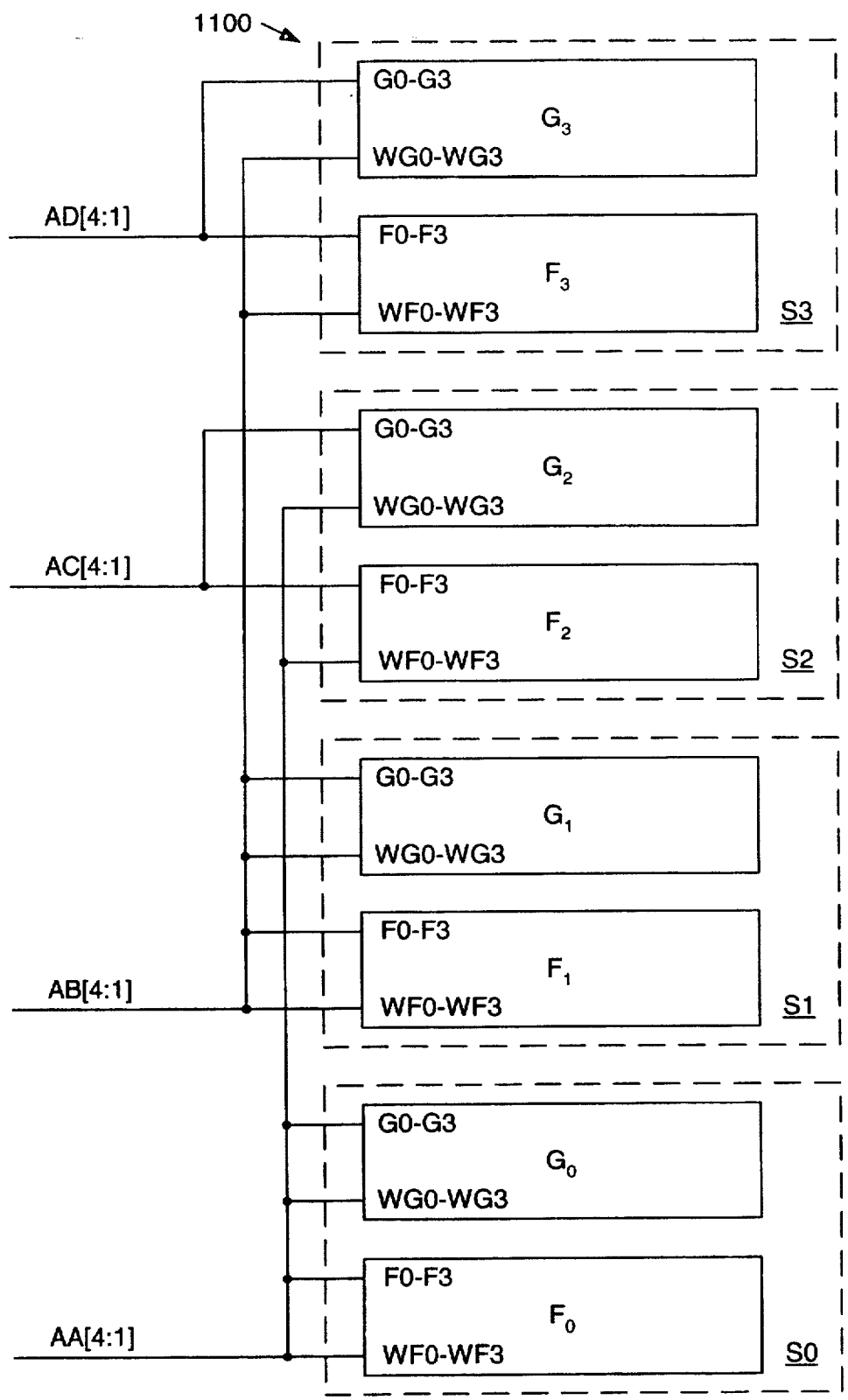
FIG. 28 is a block diagram illustrating the routing of the address signals to the function generators in the CLE slices of FIG. 22.

FIG. 28 is a block diagram of CLB 1100, which illustrates the connections to the four address inputs of function generators $F_0$–$F_3$ and $G_0$–$G_3$ in accordance with one embodiment of the present invention. Address AA[4:1] is provided as a write address signal (i.e., WF0–WF3 or WG0–WG3) to function generators $F_0$, $G_0$, $F_2$ and $G_2$.

Address AA[4:1] is also provided as a read address signal (i.e., F0–F3 or G0–G3) to function generators $F_0$ and $G_0$.

Address AB[4:1 ] is provided as a write address signal (i.e., WF0–WF3 or WG0–WG3) to function generators $F_1$, $G_1$, $F_3$ and $G_3$. Address AB[4:1 ] is also provided as a read address signal (i.e., F0–F3 or G0–G3) to function generators $F_1$ and $G_1$.

Address AC[4:1 ] is provided as a read address signal (i.e., F0–F3 or G0–G3) to function generators $F_2$ and $G_2$. Address AD[4:1] is provided as a read address signal (i.e., F0–F3 or G0–G3) to function generators $F_3$ and $G_3$.

Note that in the above-described single-port embodiments, AA[4:1 ]=AB[4:1 ]=AC[4:1 ]=AD[4:1]= $A_4$–$A_1$. However, in the dual-port embodiments addressing is implemented as follows.

64×1 Dual-Port

CLB 1100 can be configured to operate as a 64×1 dual-port RAM in the following manner. In general, function generators $F_0$–$F_1$ and $G_0$–$G_1$ are used to implement a write port of the dual-sort memory, and function generators $F_2$–$F_3$ and $G_2$–$G_3$ are used to implement a read-only port of the dual-port memory. Note that data values can also be read from function generators $F_0$–$F_1$ and $G_0$–$G_1$, thereby making the write port a read/write port, if desired. Data values are written to the 64×1 dual-port memory as follows. The write control circuits $1009_0$–$1009_3$ are configured in the manner described above for a 64×2 RAM array. As a result, write enable signals are provided to pairs of function generators as shown in Table 2. Data input multiplexers $1010_0$–$1010_3$ and $1016_0$–$1016_3$ are configured in the manner described above for a 64×2 RAM array. Thus, a single data signal is routed to both $BY_3$ and $BY_1$, and is thus provided to the data input terminal of each of the function generators $F_0$–$F_3$ and $G_0$–$G_3$.

The desired write address signals $A_4$–$A_1$ are applied to the write address terminals of function generators $F_0$–$F_3$ and $G_0$–$G_3$ as address signals AA[4:1] and AB[4:1]. As described above in connection with the 64×2 RAM, write operations will be enabled in one of function generators $F_0$–$F_1$ and $G_0$–$G_1$, and in a corresponding one of function generators $F_2$–$F_3$ and $G_2$–$G_3$. For example, a write operation may be enabled in function generators $F_0$ and $F_2$ (See, Table 2). As a result, the data written to CLB 1100 is stored in two locations, namely, at one location in function generators $F_0$–$F_1$ and $G_0$–$G_1$, and at a corresponding location in function generators $F_2$–$F_3$ and $G_2$–$G_3$.

Data can be read from the read-only port of 64×1 dual-port RAM as follows. The desired read address signals $A_4$–$A_1$ are applied to the read address terminals of function generators $F_2$–$F_3$ and $G_2$–$G_3$ as address signals AC[4:1 ] and AD[4:1 ]. As a result, read operations will be enabled in all four of these function generators $F_2$–$F_3$ and $G_2$–$G_3$ at the address location identified by the read address signals $A_4$–$A_1$. The wide function multiplexers $F5_2$, $F5_3$ and $FX_2$ are configured as described above in the 64×2 single-port RAM embodiment. These multiplexers $F5_2$, $F5_3$ and $FX_2$ are controlled to select the appropriate read output signal from function generators $F_2$–$F_3$ and $G_2$–$G_3$ in response to the address signals $A_5$ and $A_6$.

32×2, 31×1 Dual-Port RAM

CLB 1100 can be configured to operate as a 32×2 dual-port memory in the following manner. In general, function generators $F_0-F_1$ and $G_0-G_1$ and are used to implement a write port of the dual-port memory, and function generators $F_2-F_3$ and $G_2-G_3$ are used to implement a read-only port of the dual-port memory. Note that data values can also be read from function generators $F_0-F_1$ and $G_0-G_1$, thereby making the write port a read/write port, if desired. Data values are written to the 32×2 dual-port memory as follows. The write control circuits $1009_0-1009_3$ are configured in the manner described above for a 32×4 RAM array. As a result, write enable signals are provided to sets of four function generators as shown in Table 3. Data input multiplexers $1010_0-1010_3$ and $1016_0-1016_3$ are configured in the manner described above for a 32×4 RAM array. A first data signal $(BY_2/BY_0)$ is provided to the data input terminal of each of the function generators $F_0$, $F_2$ and $G_0$, and $G_2$. A second data signal $(BY_3/BY_1)$ is provided to the data input terminal of each of the function generators $F_1$, $F_3$ and $G_1$, and $G_3$.

The desired write address signals $A_4-A_1$ are applied to the write address terminals of function generators $F_0-F_3$ and $G_0-G_3$ as address signals AA[4:1] and AB[4:1]. As described above in connection with the 32×4 RAM, write operations will be enabled in one of the function generators in each of the CLE slices $S_0-S_3$. For example, write operations may be enabled at the address identified by write address $A_4-A_1$ in function generators $F_0$, $F_1$, $F_2$ and $F_3$ (or in function generators $G_0$, $G_1$, $G_2$ and $G_3$). (See, Table 3). As a result, the first data signal $(BY_2/BY_0)$ written to CLB 1100 is stored in two locations, namely, at one location in function generators $F_0$ and $G_0$ and at a corresponding location in function generators $F_2$ and $G_2$. Similarly, the second data signal $(BY_3/BY_1)$ written to CLB 1100 is stored in two locations, namely, at one location in function generators $F_1$ and $G_1$ and at a corresponding location in function generators $F_3$ and $G_3$.

Data can be read from the read-only port of 32×2 dual-port RAM as follows. The desired read address signals $A_4-A_1$ are applied to the read address terminals of function generators $F_2-F_3$ and $G_2-G_3$ as address signals AC[4:1] and AD[4:1]. As a result, read operations will be enabled in all four of these function generators $F_2-F_3$ and $G_2-G_3$ at the address location identified by the read address signals $A_4-A_1$. The wide function multiplexers $F5_0-F5_3$ are configured as described above in the 32×4 single-port RAM embodiment. Multiplexers $F5_2$ and $F5_3$ are controlled to select the appropriate read output signal from function generators $F_2-F_3$ and $G_2-G_3$ in response to the address signal $A_5$.

A 32×1 dual-port RAM can be implemented by using only half of the 32×2 dual-port RAM. For example, a 32×1 dual-port RAM can be implemented by using function generators $F_0$ and $G_0$ to form the write port, and function generators $F_2$ and $G_2$ to form the read-only port.

16×4, 16×2, 16×1 Dual-Port RAM

CLB 1100 be configured to operate as a 16×4 dual-port memory in the following manner. In general, function generators $F_0-F_1$ and $G_0-G_1$ and are used to implement a write port of the dual-port memory, and function generators $F_2-F_3$ and $G_2-G_3$ are used to implement a read-only port of the dual-port memory. Note that data values can also be read from function generators $F_0-F_1$ and $G_0-G_1$, thereby making the write port a read/write port, if desired. Data values are written to the 16×4 dual-port memory as follows. The write control circuits $1009_0-1009_3$ are configured in the manner described above for a 16×8 RAM array. The input data values are routed through multiplexers $1010_0-1010_3$ and $1016_0-1016_3$ to function generators $F_0-F_3$ and $G_0-G_3$ as described above for a 16×8 RAM array. The desired write address signals $A_4-A_1$ are applied to the write address terminals of function generators $F_0-F_3$ and $G_0-G_3$ as address signals AA[4:1] and AB[4:1]. As described above in connection with the 16×8 RAM, write operations will be enabled in each of the function generators in CLE slices $S_0-S_3$. As a result, a first bit written to CLB 1100 is stored in two locations, namely, at one location in function generator $F_0$ and at a corresponding location in function generator $F_2$. Similarly, a second bit is stored at one location in function generator $G_0$ and at a corresponding location in function generator $G_2$. A third bit is stored at location in function generator $F_1$ and at a corresponding location in function generator $F_3$. Finally, a fourth bit is red in one location in function generator $G_1$ and a responding location in function generator $G_3$.

Data can be read from the read-only port of 16×4 dual-port RAM as follows. The desired read address signals $A_4-A_1$ applied to the read address terminals of function generators $F_2-F_3$ and $G_2-G_3$ as address signals AC[4:1] and AD[4:1]. As a result, read operations will be enabled in all four of these function generators $F_2-F_3$ and $G_2-G_3$ at the address location identified by the read address signals $A_4-A_1$. As described above in the 16×8 single-port RAM embodiment, these four signals are routed directly from the function generators as read output signals.

A 16×2 or 16×1 dual-port RAM can be implemented by using only a half or a quarter, respectively, of the 16×8 dual-port RAM. For example, a 16×1 dual-port RAM can be implemented by using function generator $F_0$ to form the write port, and function generator $F_2$ to form the read-only port.

Numerous modifications and variations of the present invention are possible in light of the above teachings. Although FIGS. 7 and 10 show a memory cell programmed through only one node of the latch, the invention can also be used with memory cells in which some data signals are inverted and applied to both nodes of the latch, or in which different control signals are applied to different nodes of the latch. Further, in FIG. 10 the three transistors 706, 708, and 707 can be implemented as a multiplexer receiving input signals on lines 704, 714, and 705. And transistors 706, 708, 707, and 720 can be replaced by transmission gates. While particular multiplexer and demultiplexer implementations are shown, the invention can use other implementations as well. And, of course, different structures and methods for generating signals such as Phi1, Phi2, and WS can be used with the invention. Further, although the above embodiments show a single multiplexer with a single output terminal for selecting one signal from a plurality of memory cells, other embodiments can select more than one memory cell from which to provide an output signal. And although FIGS. 19 and 20 show a CLB with lookup tables and multiplexers for generating functions of up to 8 input signals, other embodiments can use CLBs with more lookup tables and higher order multiplexers, for example CLBs with 16 or 32 lookup tables with F9 and F10 multiplexers. A lookup table can have fewer or more than the 16 memory cells shown. For example, a 6-input lookup table would use 64 memory cells (configurable as a shift register) and the combining multiplexers would start with F7. Further, although the cascading aspect of the invention has been discussed in comparison to FIG. 8, this aspect also applies to structures with demultiplexing, such as shown in FIG. 11. More fundamentally, although the above invention has been described in connection with an FPGA, a shift register with cascade multiplexers can be formed in other structures than FPGAs, and formed not in connection with lookup tables.

It is therefore to be understood that within the scope of the appended claims, the invention may be practiced otherwise than as specifically described above.

We claim:

1. A configurable logic block (CLB) comprising:

a plurality of function generators, each having a read address port and a write address port and an output data terminal;

a first set of multiplexers ($F5_0$, $F5_1$, $FX_0$) configured to route data values from the output data terminals of a first set of the function generators ($F_0$, $G_0$, $F_1$, $G_1$);

a second set of multiplexers ($F5_2$, $F5_3$, $FX_2$) configured to route data values from the output data terminals of a second set of the function generators ($F_2$, $G_2$, $F_3$, $G_3$); and a first set of dedicated address lines (AA[4:1]) coupled to the read and write address ports of a third set of the function generators and to the write address ports of a fourth set of the function generators, wherein the third set of function generators is a subset of the first set of function generators, and the fourth set of function generators is a subset of the second set of function generators.

2. The CLB of claim 1, further comprising a second set of dedicated address lines (AC[4:1]) coupled to the read address ports of the fourth set of function generators.

3. The CLB of claim 1, further comprising a second set of dedicated address lines (AB[4:1]) coupled to the read and write address ports of a fifth set of the function generators and to the write address ports of a sixth set of the function generators, wherein the fifth set of function generators is a subset of the first set of function generators, and the sixth set of function generators is a subset of the second set of function generators.

4. The CLB of claim 3, further comprising a third set of dedicated address lines (AD[4:1]) coupled to the read address ports of the sixth set of function generators.

5. The CLB of claim 3, wherein the third and fifth sets of the function generators are mutually exclusive.

6. The CLB of claim 5, wherein the fourth and sixth sets of the function generators are mutually exclusive.

7. The CLB of claim 1, wherein the first set of multiplexers comprises a plurality of hierarchically connected multiplexers.

8. The CLB of claim 7, wherein the second set of multiplexers comprises a plurality of hierarchically connected multiplexers.

9. The CLB of claim 1, wherein the third and fourth sets of function generators form a dual-port random access memory (RAM).

10. The CLB of claim 3, wherein the third, fourth, fifth and sixth sets of function generators form a dual-port random access memory (RAM).

11. A configurable logic block (CLB) comprising:

$2^N$ function generators, where N is an integer greater than one, each of the function generators having a write enable port; and a plurality of write control circuits, each being coupled to the write enable ports of a pair of the function generators, and each generating a pair of write control signals in response to N write control signals.

12. The CLB of claim 11, further comprising circuitry for enabling and disabling at least one of the N write control signals.

* * * * *